(12) United States Patent
Darrah et al.

(10) Patent No.: US 11,899,081 B2
(45) Date of Patent: *Feb. 13, 2024

(54) WIRELESS SENSOR WITH BEACON TECHNOLOGY

(71) Applicant: Barnes Group Inc., Bristol, CT (US)

(72) Inventors: Kevin R. Darrah, Medina, OH (US); Michael O. Culbertson, Cuyahoga Falls, OH (US); Steven J. Reilly, Westlake, OH (US); Kelvin L. Knipl, Jr., Litchfield, OH (US)

(73) Assignee: BARNES GROUP INC., Bristol, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/100,926

(22) Filed: Jan. 24, 2023

(65) Prior Publication Data

US 2023/0228827 A1     Jul. 20, 2023

Related U.S. Application Data

(63) Continuation of application No. 17/113,294, filed on Dec. 7, 2020, now Pat. No. 11,592,499.

(Continued)

(51) Int. Cl.
*G08B 21/00* (2006.01)
*G01R 33/07* (2006.01)
(Continued)

(52) U.S. Cl.
CPC ............ *G01R 33/07* (2013.01); *G01D 21/02* (2013.01); *G01K 7/00* (2013.01); *G01P 15/14* (2013.01);
(Continued)

(58) Field of Classification Search
USPC ... 340/500, 531, 539.1, 539.11, 539.12, 540, 340/573.1, 10.1, 10.5, 10.51, 539.16,
(Continued)

(56) References Cited

U.S. PATENT DOCUMENTS

| 6,070,521 A | 6/2000 | Otoshi |
| 6,202,491 B1 | 3/2001 | McCarty et al. |

(Continued)

FOREIGN PATENT DOCUMENTS

| CA | 2635698 | 7/2006 |
| CN | 102073300 | 5/2011 |

(Continued)

OTHER PUBLICATIONS

U.S. Search Authority, International Search Report and Written Opinion for corresponding application No. PCT/US2020/063549 (dated Apr. 23, 2021).

*Primary Examiner* — Daniel Previl
(74) *Attorney, Agent, or Firm* — CANTOR COLBURN LLP

(57) ABSTRACT

A wireless sensor for an associated machine or machine part which includes a communications module that wirelessly transmits data related to the associated machine or machine part. The communications module is mounted on the sensor and the sensor is disposed under the bottom side of the control circuitry. A sensor is configured to measure one or more properties of the associated machine or machine part. The wireless sensor can be used with a smart device app such that information from the wireless sensor can be received and displayed on the smart device.

20 Claims, 10 Drawing Sheets

Related U.S. Application Data

(60) Provisional application No. 62/961,877, filed on Jan. 16, 2020, provisional application No. 62/945,999, filed on Dec. 10, 2019.

(51) Int. Cl.

| | | |
|---|---|---|
| *H04L 67/12* | (2022.01) | |
| *H04W 52/02* | (2009.01) | |
| *H04W 4/38* | (2018.01) | |
| *G01P 15/18* | (2013.01) | |
| *G01K 7/00* | (2006.01) | |
| *G01P 15/14* | (2013.01) | |
| *G01D 21/02* | (2006.01) | |
| *G05B 19/042* | (2006.01) | |
| *G08C 17/02* | (2006.01) | |
| *H04L 67/125* | (2022.01) | |

(52) U.S. Cl.
CPC .......... *G01P 15/18* (2013.01); *G05B 19/0428* (2013.01); *G08C 17/02* (2013.01); *H04L 67/12* (2013.01); *H04L 67/125* (2013.01); *H04W 4/38* (2018.02); *H04W 52/0235* (2013.01)

(58) Field of Classification Search
USPC ............ 340/539.17, 539.19, 539.26, 870.01, 340/870.26; 310/90.5, 216.022, 71, 310/216.009, 216.114, 216.125, 254.1, 310/68 B; 345/8; 349/138, 142, 200, 33; 382/131, 100, 128, 132; 711/104, 154, 711/163, E12.001; 164/369, 1, 139, 146, 164/149, 150.1, 152, 154.1, 157, 158, 164/159, 250.1, 253, 259, 260, 262, 266, 164/267, 269, 270.1, 271, 374, 394, 397, 164/401, 409, 410, 411, 445, 447, 412, 164/900, DIG. 1, DIG. 2, DIG. 3, DIG. 4, 164/DIG. 5, DIG. 6, DIG. 7, DIG. 8, 164/DIG. 9, DIG. 10, DIG. 11, DIG. 12, 164/DIG. 13, DIG. 14, DIG. 15, 164/FOR. 000; 351/159.39, 571, 1, 107, 351/196.1, 227, 237, 325, 326, 333, 350, 351/362, 436, 443, 462, 478, 483.01, 480, 351/503, 507, 515, 554, 558, 577, 591, 351/599, 600, 601, 615, 616, 618, 642, 351/641, 831, 838, 885, 893, 894, 896, 351/900, 901, 902, 903, 904, FOR. 000, 351/FOR. 100; 370/351, 395.2, 401; 307/104; 341/157; 701/50, 1, 400, 300, 701/FOR. 000, FOR. 107; 702/182, 184, 702/188; 703/8, 2; 172/2, 3, 4.5; 37/348, 379, 414; 709/224, 201, 204, 709/208, 212, 213, 217, 220, 227, 223, 709/238, 230, 245, 246, 248, 249, 250, 709/251, 252, 253, 200, FOR. 000, 709/FOR. 103

See application file for complete search history.

(56) References Cited

U.S. PATENT DOCUMENTS

| | | |
|---|---|---|
| 6,209,400 B1 | 4/2001 | Schoch et al. |
| 6,665,580 B1 | 12/2003 | Susnjara |
| 6,738,729 B1 | 5/2004 | Schoch |
| 7,206,916 B2 | 4/2007 | Boatwright et al. |
| 7,342,506 B2 | 3/2008 | Paoli et al. |
| 7,378,953 B2 | 5/2008 | Coronel et al. |
| 7,457,785 B1 | 11/2008 | Greitzer et al. |
| 7,900,520 B2 | 3/2011 | Colombo |
| 8,700,924 B2 | 4/2014 | Mian et al. |
| 8,836,503 B2 | 9/2014 | Gelvin et al. |
| 9,301,266 B2 | 3/2016 | Sampath et al. |
| 9,578,398 B2 | 2/2017 | Svoen et al. |
| 9,736,554 B2 | 8/2017 | Hershberger et al. |
| 9,841,335 B2 | 12/2017 | Rueth et al. |
| 10,048,152 B2 | 8/2018 | Fetisov et al. |
| 10,068,455 B1 | 9/2018 | Stong et al. |
| 10,627,090 B2 | 4/2020 | Mostoller et al. |
| 10,697,809 B1 | 6/2020 | Muller et al. |
| 10,782,675 B2 | 9/2020 | Mangino |
| 10,793,171 B2 | 10/2020 | Nishimura et al. |
| 11,592,499 B2 * | 2/2023 | Darrah ............... G05B 19/042 |
| 2002/0170337 A1 | 11/2002 | Futamura et al. |
| 2003/0014150 A1 | 1/2003 | Flanagan et al. |
| 2003/0030565 A1 | 2/2003 | Sakatani et al. |
| 2003/0060901 A1 | 3/2003 | Mailliet et al. |
| 2003/0234730 A1 | 12/2003 | Arms et al. |
| 2004/0020201 A1 | 2/2004 | Feigel et al. |
| 2005/0143956 A1 | 6/2005 | Long et al. |
| 2005/0274243 A1 | 12/2005 | Shiroza et al. |
| 2006/0145840 A1 | 7/2006 | Klun |
| 2006/0225475 A1 | 10/2006 | Kako |
| 2006/0251484 A1 | 11/2006 | Yoshida et al. |
| 2007/0264938 A1 | 5/2007 | Srinivasan et al. |
| 2007/0196214 A1 | 8/2007 | Bocchiola |
| 2007/0211654 A1 | 9/2007 | Kim et al. |
| 2008/0073993 A1 * | 3/2008 | Sortore ............... F16C 32/0489 |
| | | 310/90.5 |
| 2008/0173618 A1 | 7/2008 | Chuang et al. |
| 2008/0178676 A1 | 7/2008 | Evangelos et al. |
| 2008/0216556 A1 | 9/2008 | Skwara |
| 2009/0018781 A1 | 1/2009 | Diezel et al. |
| 2009/0025444 A1 | 1/2009 | Yuichi |
| 2009/0044585 A1 | 2/2009 | Hollerbach et al. |
| 2009/0158810 A1 | 6/2009 | Haseba et al. |
| 2009/0038139 A1 | 9/2009 | Hoernig et al. |
| 2010/0102907 A1 | 4/2010 | Schebel et al. |
| 2010/0038172 A1 | 6/2010 | Reinmuth |
| 2010/0206187 A1 | 8/2010 | DeSantis et al. |
| 2011/0005387 A1 | 1/2011 | Wolf et al. |
| 2011/0022554 A1 | 2/2011 | Reckmann et al. |
| 2011/0109424 A1 | 3/2011 | Huizenga et al. |
| 2011/0132207 A1 | 6/2011 | Schmeink |
| 2011/0235041 A1 | 9/2011 | Rao et al. |
| 2012/0020445 A1 | 1/2012 | DiStasi et al. |
| 2012/0319866 A1 | 12/2012 | Svoen et al. |
| 2013/0041997 A1 | 2/2013 | Li et al. |
| 2013/0046714 A1 | 2/2013 | Harris |
| 2013/0103182 A1 | 4/2013 | Catino et al. |
| 2013/0151002 A1 | 6/2013 | Brunet et al. |
| 2013/0154624 A1 | 6/2013 | Taylor |
| 2013/0226317 A1 | 8/2013 | Vijayaraghavan et al. |
| 2013/0253670 A1 | 9/2013 | Zheng et al. |
| 2014/0121996 A1 | 5/2014 | Piety et al. |
| 2014/0202223 A1 | 7/2014 | Iwamura et al. |
| 2014/0266688 A1 | 9/2014 | Clark et al. |
| 2014/0366606 A1 | 12/2014 | Yasayuki et al. |
| 2015/0047517 A1 | 2/2015 | Spieshofer |
| 2015/0088454 A1 | 3/2015 | Kimura et al. |
| 2015/0134733 A1 | 5/2015 | Asenjo et al. |
| 2015/0142154 A1 | 5/2015 | Tiano |
| 2015/0241463 A1 | 8/2015 | Kraige et al. |
| 2015/0333535 A1 * | 11/2015 | Feine ............... A61B 5/4547 |
| | | 307/104 |
| 2015/0350303 A1 | 12/2015 | Lin et al. |
| 2015/0381776 A1 | 12/2015 | Dong et al. |
| 2016/0082502 A1 * | 3/2016 | Appleby ............... B23P 15/246 |
| | | 164/369 |
| 2016/0091393 A1 | 3/2016 | Kleer et al. |
| 2016/0184876 A1 | 6/2016 | Kondo et al. |
| 2016/0219517 A1 | 7/2016 | Ylamurto et al. |
| 2016/0041068 A1 | 10/2016 | Wascat et al. |
| 2016/0339556 A1 | 11/2016 | Sodemann et al. |
| 2016/0375733 A1 | 12/2016 | Lesesky et al. |
| 2017/0012430 A1 * | 1/2017 | Gillett ............... H02J 3/381 |
| 2017/0103196 A1 | 4/2017 | Anderson et al. |
| 2017/0163608 A1 | 6/2017 | Rowson et al. |
| 2017/0243934 A1 | 8/2017 | Bassat |

(56) References Cited

U.S. PATENT DOCUMENTS

| | | |
|---|---|---|
| 2017/0252792 A1 | 9/2017 | Canti et al. |
| 2017/0293517 A1 | 10/2017 | Dion |
| 2017/0305045 A1 | 10/2017 | Antonini et al. |
| 2018/0048030 A1* | 2/2018 | Hinterberger ..... H01M 10/4257 |
| 2018/0052442 A1 | 2/2018 | Cheng et al. |
| 2018/0172615 A1 | 6/2018 | Lau |
| 2018/0181105 A1 | 6/2018 | Shindou |
| 2018/0272491 A1 | 9/2018 | Chen et al. |
| 2018/0293125 A1 | 10/2018 | Lavid Ben Lulu et al. |
| 2018/0293516 A1 | 10/2018 | Lavid Ben Lulu et al. |
| 2018/0354219 A1 | 12/2018 | Kohno et al. |
| 2019/0030582 A1 | 1/2019 | Olsson |
| 2019/0141173 A1 | 5/2019 | Ohishi |
| 2019/0277805 A1 | 9/2019 | Wrobel |
| 2019/0317055 A1 | 10/2019 | Albers et al. |
| 2019/0353506 A1 | 11/2019 | Yoda |
| 2019/0391031 A1 | 12/2019 | Kawase et al. |
| 2020/0088648 A1 | 3/2020 | Rohmann et al. |
| 2020/0358852 A1 | 11/2020 | Burke et al. |

FOREIGN PATENT DOCUMENTS

| | | |
|---|---|---|
| CN | 203078240 | 7/2013 |
| CN | 203929314 | 11/2014 |
| CN | 204320846 | 5/2015 |
| CN | 105651415 | 6/2016 |
| CN | 106217128 | 12/2016 |
| CN | 206114182 | 4/2017 |
| CN | 106709644 | 5/2017 |
| CN | 107831738 | 3/2018 |
| CN | 207074095 | 3/2018 |
| CN | 108490880 | 9/2018 |
| CN | 108747590 | 11/2018 |
| CN | 108871652 | 11/2018 |
| CN | 108942409 | 12/2018 |
| CN | 109048492 | 12/2018 |
| CN | 109262368 | 1/2019 |
| CN | 109318055 | 2/2019 |
| CN | 208672217 | 3/2019 |
| CN | 209432340 | 9/2019 |
| CN | 211013360 | 7/2020 |
| DE | 102004034706 | 2/2006 |
| DE | 102006031438 | 1/2008 |
| DE | 102006034974 | 1/2008 |
| DE | 102007059741 | 6/2009 |
| DE | 102010033001 | 12/2011 |
| DE | 202012003867 | 7/2012 |
| DE | 102011011824 | 8/2012 |
| DE | 102011054838 | 4/2013 |
| DE | 102011087862 | 6/2013 |
| DE | 102011120789 | 6/2013 |
| DE | 202013102485 | 6/2013 |
| DE | 102012001661 | 8/2013 |
| DE | 102012005555 | 8/2013 |
| DE | 102012011893 | 12/2013 |
| DE | 102012013371 | 1/2014 |
| DE | 102013107307 | 1/2015 |
| DE | 102014201273 | 7/2015 |
| DE | 202014101507 | 7/2015 |
| DE | 202014101508 | 7/2015 |
| DE | 202014101509 | 7/2015 |
| DE | 102014214201 | 1/2016 |
| DE | 102015101326 | 8/2016 |
| DE | 102016005847 | 11/2016 |
| DE | 102015224778 | 6/2017 |
| DE | 102016205704 | 10/2017 |
| DE | 202017006714 | 2/2018 |
| DE | 102016011604 | 3/2018 |
| DE | 202018102349 | 5/2018 |
| DE | 202018102351 | 5/2018 |
| DE | 102017214378 | 2/2019 |
| EP | 1308268 | 5/2003 |
| EP | 2937593 | 10/2015 |
| EP | 2937594 | 10/2015 |
| EP | 2937595 | 10/2015 |
| EP | 3002650 | 4/2016 |
| ES | 2373150 | 1/2012 |
| ES | 1144184 | 9/2015 |
| FR | 2963747 | 2/2012 |
| FR | 3008010 | 1/2015 |
| JP | 2010149244 | 7/2010 |
| JP | 2013040936 | 2/2013 |
| JP | 2013107098 | 6/2013 |
| JP | 2016097485 | 5/2016 |
| JP | 2017030065 | 2/2017 |
| JP | 2018161698 | 10/2018 |
| KR | 101377531 | 3/2014 |
| KR | 20140026005 | 3/2014 |
| KR | 20180031498 | 3/2018 |
| TW | 201226100 | 7/2012 |
| TW | 201226102 | 7/2012 |
| WO | 2004067225 | 8/2004 |
| WO | 2007022754 | 3/2007 |
| WO | 2008071154 | 6/2008 |
| WO | 2009036874 | 3/2009 |
| WO | 2009053323 | 4/2009 |
| WO | 2013151456 | 10/2013 |
| WO | 2014009218 | 1/2014 |
| WO | 2014086328 | 6/2014 |
| WO | 2017194617 | 11/2017 |
| WO | 2018001678 | 1/2018 |
| WO | 2018030939 | 2/2018 |
| WO | 2018127940 | 7/2018 |
| WO | 2018189602 | 10/2018 |
| WO | 2019020269 | 1/2019 |

* cited by examiner

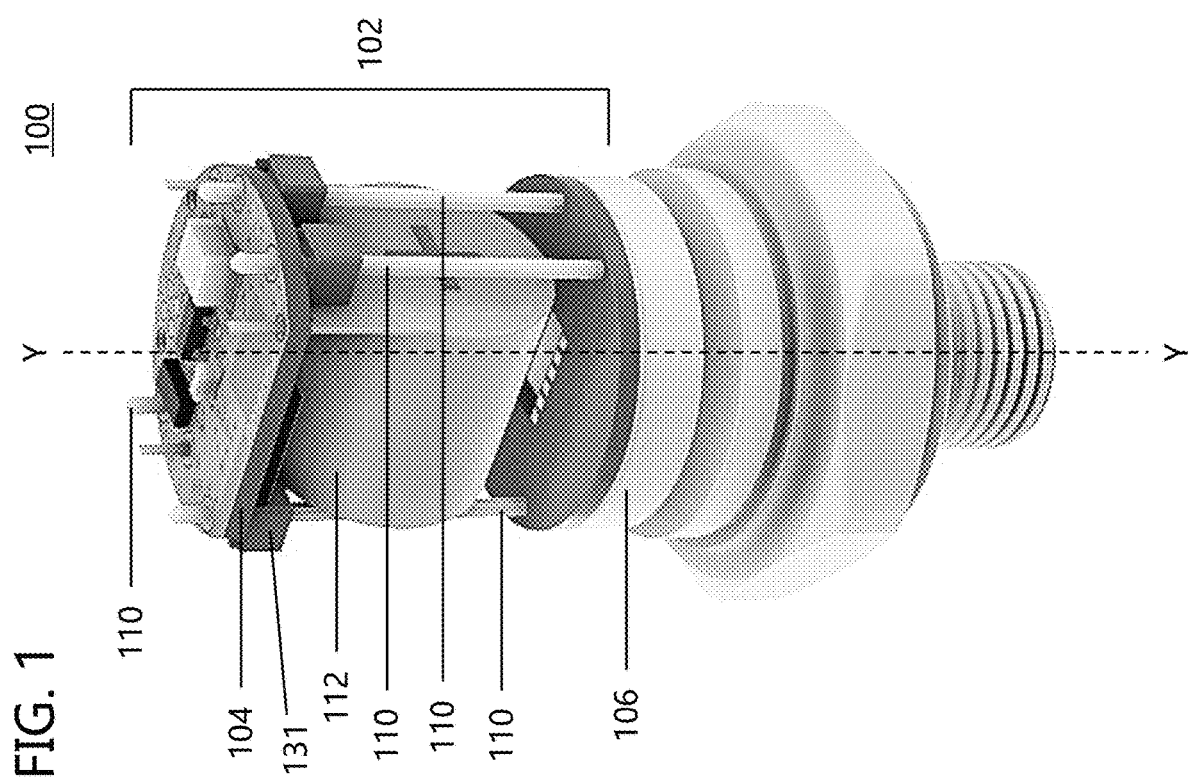

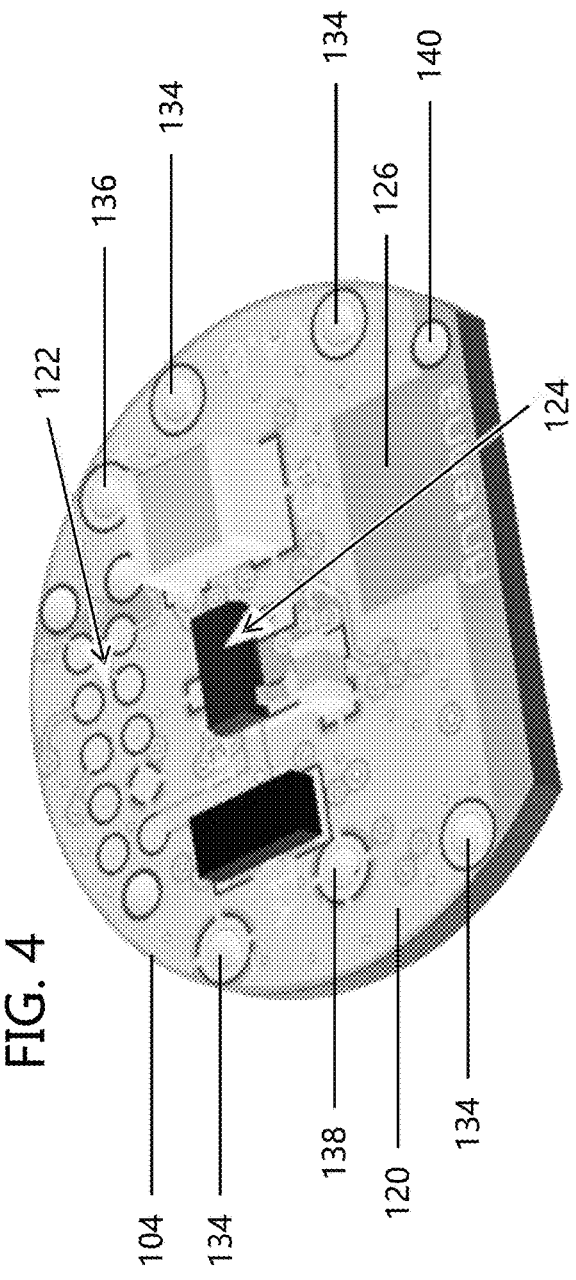

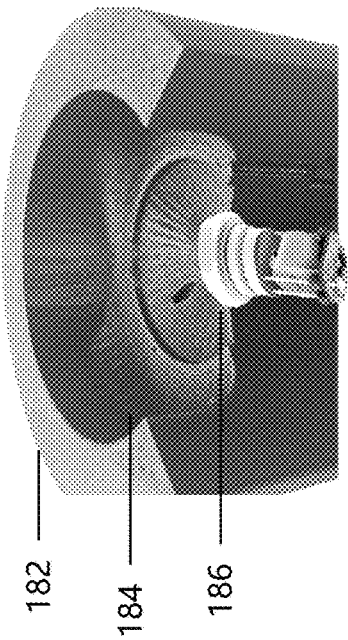
FIG. 12
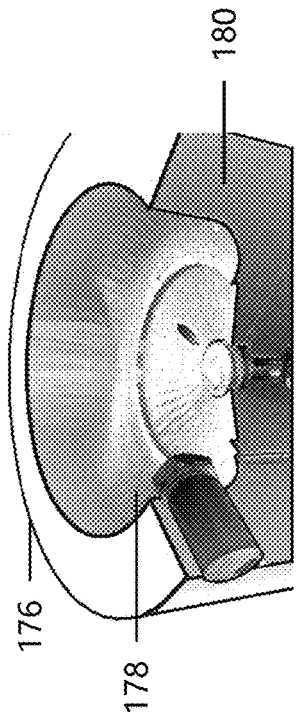
FIG. 13
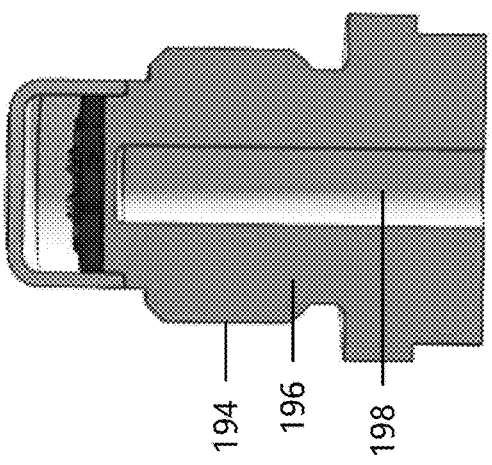
FIG. 14
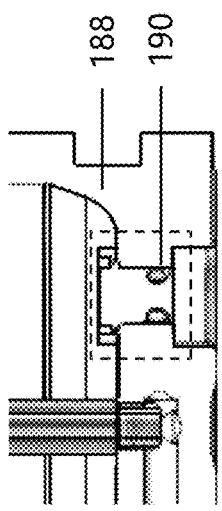
FIG. 15A
FIG. 15B
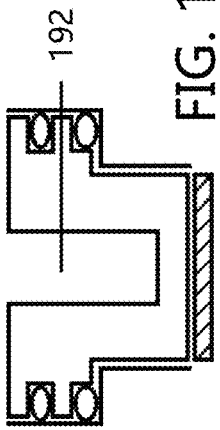
FIG. 16

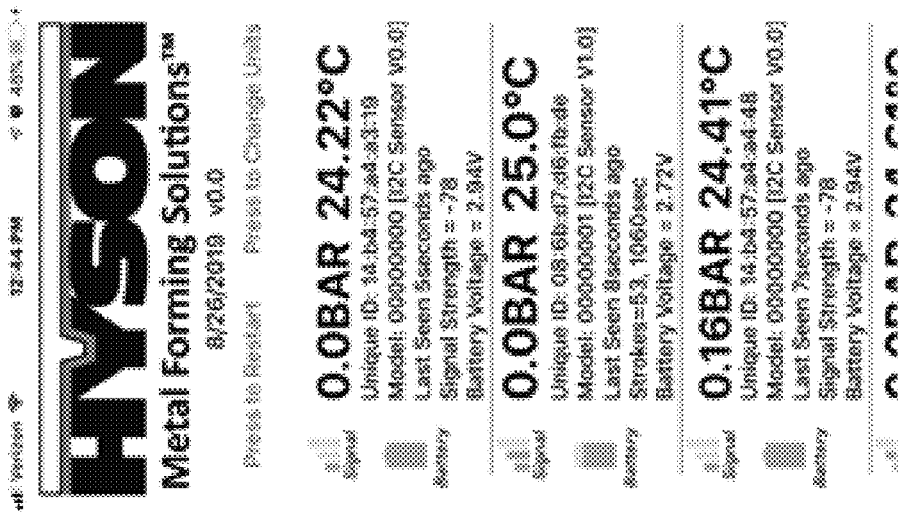
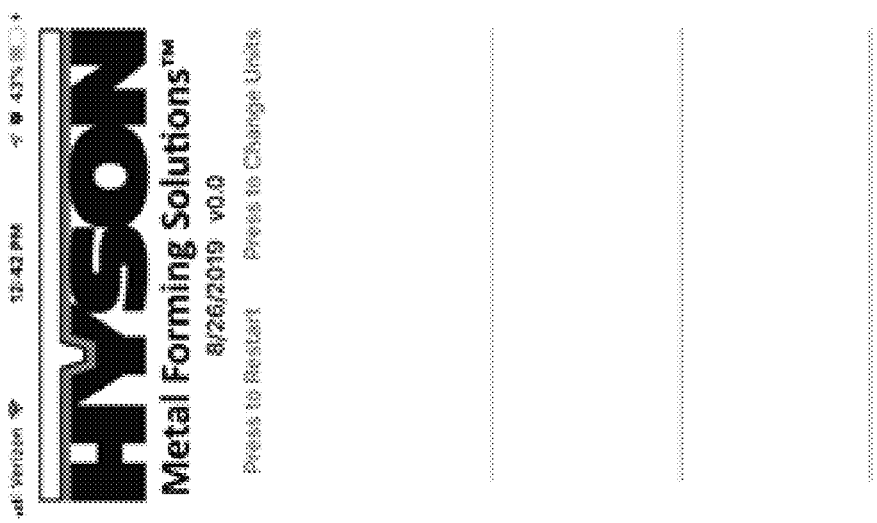
FIG. 17

WIRELESS SENSOR WITH BEACON TECHNOLOGY

The present disclosure is a continuation of U.S. patent application Ser. No. 17/113,294 filed Dec. 7, 2020, which in turn claims priority on U.S. Provisional Patent Application Serial Nos. 62/945,999 filed Dec. 10, 2019 and 62/961,877 filed Jan. 16, 2020 which are incorporated herein by reference.

The present disclosure sets forth devices, systems, and methods related to a wireless sensor adapted for determining, sensing/detecting, and/or measuring one or more properties (e.g., measuring pressure, measuring temperature, location, etc.) of an associated machine or a part of the associated machine. It finds particular application in conjunction with communication devices which transmit information related to the associated machine or part of the associated machine, and will be described with particular reference thereto. However, it is to be appreciated that the present exemplary embodiment is also amenable to other like applications.

BACKGROUND

Temperature and pressure sensor-type devices are known in the art for use with various types of machines and machine components. Existing commercial sensors have utilized wireless communication, such as Bluetooth, to transmit the information obtained from such sensors. However, the large size of these existing commercial sensors has limited their use in some types of machines. Existing commercial sensors, such as pressure sensors, have also exhibited up to a 100% fail rate when mounted in machines subject to high shock or vibration. Moreover, traditional wireless protocols have limited the usefulness of existing commercial sensors.

It would be desirable to provide a small, robust, low cost wireless sensor which addresses the aforementioned and other issues of existing sensor devices.

BRIEF DESCRIPTION

In accordance with one non-limiting aspect of the present disclosure, a wireless sensor for an associated machine or machine part is disclosed. The wireless sensor includes a communications module that collects, stores, measures, and/or transmits data related to the associated machine or machine part, and/or provides information about the wireless sensor.

In accordance with another and/or alternative non-limiting aspect of the present disclosure, the communications module includes control circuitry that can optionally control the wireless sensor. The wireless sensor can be configured to measure one or more properties related to the associated machine or machine part, and/or provide information about the wireless sensor. In one non-limiting embodiment, the communications module of the wireless sensor is configured to transmitted information (e.g., wirelessly transmit information and/or transmit information via a hardwire or other physical connection) that relates to one or more properties of the machine or machine part and/or data related to the wireless sensor (e.g., model number of machine/machine part, model number of wireless sensor, firmware version used in wireless sensor, serial number of machine/machine part, serial number of wireless sensor, pressure information, temperature information, wireless sensor location information, location information of the machine or machine part, movement information of the wireless sensor, movement information of the machine or machine part, battery status/level information of wireless sensor, voltage information of wireless sensor, low voltage information of wireless sensor, signal strength information of wireless sensor, operation mode of the wireless sensor, unique identifier of the wireless sensor, power level of wireless sensor, battery life of battery in wireless sensor, error information regarding the wireless sensor, operational time of the wireless sensor, operational time of machine or machine part, operational/run mode or sleep mode of the wireless sensor, the highest pressure measured/detected by the wireless sensor or a series of the highest pressures measured/detected by the wireless sensor, the highest temperature measured/detected by the wireless sensor or a series of the highest temperatures measured/detected by the wireless sensor, the date and/or time associated with one or more of the measured/detected properties, the number of times a measured/detected property of the machine or machine part has fallen outside a set parameter or parameter range, the number of times a measured/detected property of the machine or machine part has met a set parameter or fallen within a parameter range, vibration level information, duty time of machine or machine part, and/or number of times wireless sensor wirelessly transmitted information during a certain time period.

In accordance with another and/or alternative non-limiting aspect of the present disclosure, the communications module is optionally mounted on a sensor. The sensor can be configured to only measure or detect a single property (e.g., measure only pressure, measure only temperature, etc.), or can be configured to measure or detect multiple properties (e.g., measure both pressure and temperature, measure both pressure and vibrations, measure pressure, temperature and vibrations, etc.). The sensor is optionally disposed under the bottom side of the control circuitry of the communications module; however, the sensor can be located in other locations relative to the control circuitry of the communications module.

In accordance with another and/or alternative non-limiting aspect of the present disclosure, the one or more properties collected by the communications module can be 1) continuously transmitted wirelessly from the wireless sensor, and/or 2) periodically transmitted wirelessly from the wireless sensor (e.g., data transmitted at specified intervals of time).

In accordance with another and/or alternative non-limiting aspect of the present disclosure, the communications module can optionally be configured to transmit all collected and/or stored data in each transmission, or transmit certain types of data at different time intervals from other types of collected and/or stored data. For example, certain types of data (e.g., firmware version used in wireless sensor, voltage information of wireless sensor, low voltage information of wireless sensor, signal strength information of wireless sensor, operation mode of the wireless sensor, power level of wireless sensor, battery life of battery in wireless sensor, error information regarding the wireless sensor, operational time of the wireless sensor, operational time of machine or machine part, operational/run mode or sleep mode of the wireless sensor, the highest pressure measured/detected by the wireless sensor or a series of the highest pressures measured/detected by the wireless sensor, the highest temperature measured/detected by the wireless sensor or a series of the highest temperatures measured/detected by the wireless sensor, the number of times a measured/detected property of the machine or machine part has fallen outside a set parameter or parameter range, the number of times a measured/detected property of the machine or machine part has met a set parameter or fallen within a parameter range, and/or duty time of machine or machine part, number of times the wireless sensor wirelessly transmitted information during a certain time period, etc.) may not need to be transmitted each time data is transmitted from the communications module. As such, information deemed more important for continuous and more frequent periodic transmission can be transmitted continuously or at some predefined time interval (information transmitted every 1-15 sec. (and all values and ranges therebetween), etc.), and other information that is deemed less important can be transmitted at some longer predefined time interval (information transmitted every 25-500 sec. (and all values and ranges therebetween), etc.). By not transmitting all of the collected or stored information continuously or at certain transmission intervals, the battery life of the wireless sensor can be advantageously extended. As can be appreciated, more than two different information transmissions can occur from the communications module. Important information can be continuously transmitted or transmitted at frequent time intervals (information transmitted every 1-15 sec. (and all values and ranges therebetween), etc.), moderately important information can be transmitted at longer intervals (information transmitted every 25-500 sec. (and all values and ranges therebetween), etc.), and even less important information can be transmitted at even longer intervals (information transmitted every 125 sec. to every 5 min. (and all values and ranges therebetween), etc.) The frequency of transmission of different types of information by the communications module can be customized for a particular application. The wireless sensor can be designed so that the time intervals to transmit certain types of information can be manually programmed or wirelessly programmed into the wireless sensor.

In accordance with another and/or alternative non-limiting aspect of the present disclosure, the one or more properties measured/detected by the wireless sensor optionally include pressure of the associated machine or machine part (e.g., pressure in a cylinder of a spring, etc.), the temperature in the associated machine or machine part (e.g., temperature in a cylinder of a spring, etc.), the highest pressure measured/detected by the wireless sensor or a series of the highest pressures measured/detected by the wireless sensor (e.g., 1-100 highest pressures measured/detected (and all values and ranges therebetween), etc.), the highest temperature measured/detected by the wireless sensor or a series of the highest temperatures measured/detected by the wireless sensor (e.g., 1-100 highest temperatures measured/detected (and all values and ranges therebetween), etc.), etc. The one or more properties measured/detected by the wireless sensor can be associated with a date and/or time; however, this is not required.

In accordance with another and/or alternative non-limiting aspect of the present disclosure, the wireless sensor optionally stores information in its memory. The type of stored information is non-limiting (e.g., model number of machine/machine part, model number of wireless sensor, firmware version used in wireless sensor, serial number of machine/machine part, serial number of wireless sensor, pressure information, temperature information, wireless sensor location information, location information of the machine or machine part, movement information of the wireless sensor, movement information of the machine or machine part, battery status/level information of wireless sensor, voltage information of wireless sensor, low voltage information of wireless sensor, signal strength information of wireless sensor, operation mode of the wireless sensor, unique identifier of the wireless sensor, power level of wireless sensor, battery life of battery in wireless sensor, error information regarding the wireless sensor, operational time of the wireless sensor, operational time of machine or machine part, operational/run mode or sleep mode of the wireless sensor, the highest pressure measured/detected by the wireless sensor or a series of the highest pressures measured/detected by the wireless sensor, the highest temperature measured/detected by the wireless sensor or a series of the highest temperatures measured/detected by the wireless sensor, the date and/or time associated with one or more of the measured/detected properties, the number of times a measured/detected property of the machine or machine part has fallen outside a set parameter or parameter range, the number of times a measured/detected property of the machine or machine part has met a set parameter or fallen within a parameter range, vibration level information, and/or duty time of machine or machine part, number of times the wireless sensor wirelessly transmitted information during a certain time period, etc.). The wireless sensor includes memory which is built into the communications module. The data stored in memory can optionally be securely locked in memory; however, this is not required. For instance, one or more pieces of data can be securely locked in memory in the wireless sensor and can only be accessed by use of a security code/password or by other security protocols. The wireless sensor can be optionally designed such that if one or more attempts to access the secured data occurs without use of the security code/password or by unauthorized security protocols, the stored data is permanently erased from memory. In another non-limiting embodiment, all or a portion of the data in memory can be "burned" into memory such that if there is a power failure to the wireless sensor and/or damage to a circuit other than the memory or memory circuit, the "burned" data can be accessed again once power is restored to the wireless sensor. The "burned" data can be partially or fully replaced with other "burned" data after certain time intervals (e.g., every 1 sec., every 10 sec., every 5 min., every hour, every day, every month, etc.) and/or after a new or measured or detected event (e.g., new firmware loaded, new high pressure measured/detected, new high temperature measured/detected, etc.).

In accordance with another and/or alternative non-limiting aspect of the present disclosure, the communications module optionally includes a motion sensor (e.g., accelerometer, gyroscope, etc.) connected to the control circuitry (e.g., attached to the bottom side of the control circuitry, etc.). The motion sensor provides data related to movement of the associated machine or machine part. The data provided by the motion sensor can be included in the data provided by the communications module. The motion sensor can be use used to 1) track location movement of the wireless sensor, and/or 2) track movement of a machine or machine part to which the wireless sensor is connected thereto. The motion sensor (when used) can be used for security purposes to ensure that a machine or machine part is not being moved or operated without authorization. The motion sensor (when used) can be used to ensure that a machine or machine part is operating and/or properly operating. For example, if the motion sensor detects movement of the machine or machine part, the wireless sensor can transmit information that the machine or machine part is in use or operation. Also, if the motion sensor detects erratic movement, untimely movement, excessive movement, less than normal movement, movement in the wrong direction, vibrations, etc., the wireless sensor can transmit information that the machine or machine part is not properly operating.

When the motion sensor includes an accelerometer, the accelerometer can be used to measure the speed of movement of a machine or machine part, and/or movement of a piston or cylinder of a spring. As such, if the wireless sensor was located on a piston or cylinder of a spring or the like, and/or was located on a moving part of a machine or device, the accelerometer could be used to measure the speed of movement of the piston, cylinder, and/or moving part of a machine or device, the number of strokes of piston and/or cylinder, time period for a stroke of the piston and/or cylinder, the active time a machine or machine part was used, time period that the wireless sensor was located on or associated with a machine or machine part, and/or capture/monitor X, Y, Z tilt or changes in movement of wireless sensor or machine or machine part associated with the wireless sensor, etc. When the motion sensor include a gyroscope (e.g., 6-axis gyroscope, etc.), the gyroscope can be used to a) measure the speed of movement of a machine or machine part, and/or movement of a piston or cylinder of a spring, b) detect/measure multi-axis movement of a machine or machine part, and/or movement of a piston or cylinder of a spring, c) provide location information regarding the wireless sensor and/or machine or machine part (e.g., location of the wireless sensor or machine or machine part that includes the wireless sensor in a factory, plant, storage room, etc.), d) facilitate in 1) proper location (e.g., the machine or machine part is being installed in a proper location on another device or machine, etc.) when installing the machine or machine part, and/or 2) proper positioning and/or proper orientation of a machine or machine part when installing the machine or machine part (e.g., the front face of the machine part is properly facing the front and not the rear during installation, the machine part is installed at the proper angle, the machine part is installed at the proper depth, etc.

In accordance with another and/or alternative non-limiting aspect of the present disclosure, the wireless sensor optionally includes a magnetic sensor/switch. The magnetic sensor/switch can be attached to the control circuitry (e.g., attached to the top side of the control circuitry, etc.). The magnetic sensor/switch can be a Hall effect sensor/switch; however, this is not required. The magnetic sensor/switch can be used to 1) manually activate the wireless sensor by use of a handheld magnet and/or other type of magnetic device, 2) manually activate the wireless sensor by use of a handheld magnet and/or other type of magnetic device, 3) manually place the wireless sensor into one or more sleep modes by use of a handheld magnet and/or other type of magnetic device, 4) manually wake the wireless sensor from one or more sleep modes by use of a handheld magnet and/or other type of magnetic device, 5) cause the wireless sensor to transmit a signal that indicates that a handheld magnet and/or other type of magnetic device has been placed in close proximity (e.g., 0-5 ft. and all values and ranges therebetween) to the magnetic sensor/switch, 6) cause the wireless sensor to move from the sleep mode to the operational/run mode and to transmit information normally transmitted by the wireless sensor while in the operational/run mode, and/or 7) change (e.g., increase or decrease) the time interval between wireless information/data transmission by the wireless sensor. In one non-limiting configuration, the time interval between wireless information/data transmission by the wireless sensor is decreased from 2-20 sec. intervals to less than 1 sec. intervals (e.g., 20-200 ms (and all values and ranges therebetween), etc.) when a handheld magnet and/or other type of magnetic device has been placed in close proximity to the magnetic sensor/switch of the wireless sensor. In another non-limiting configuration, the wireless sensor enters deep sleep mode when a handheld magnet and/or other type of magnetic device has been placed in close proximity to the magnetic sensor/switch of the wireless sensor for more than 5-30 sec. (and all values and ranges therebetween). In another non-limiting configuration, the wireless sensor enters the sleep mode or operational/run mode from the deep sleep mode when a handheld magnet and/or other type of magnetic device has been placed in close proximity to the magnetic sensor/switch of the wireless sensor for more than 5-30 sec. As can be appreciated, the wireless sensor can optionally send a wireless signal indicating that the wireless sensor is about to enter the deep sleep mode (e.g., notice that it will enter deep sleep more in some time period [e.g., 5-30 sec. (and all values and ranges therebetween), etc.]), and/or that the wireless sensor has just exited the deep sleep mode.

In accordance with another and/or alternative non-limiting aspect of the present disclosure, the wireless sensor optionally includes a "near field" device or RFID device. The "near field" device or RFID device can be attached to the control circuitry (e.g., attached to the top side of the control circuitry, etc.). The "near field" device or RFID device can be used to 1) obtain information about the wireless sensor and/or machine or machine part to which the sensor is connected or associated therewith (e.g., model number of machine/machine part, model number of wireless sensor, firmware version used in wireless sensor, serial number of machine/machine part, serial number of wireless sensor, battery status/level information of wireless sensor, voltage information of wireless sensor, low voltage information of wireless sensor, signal strength information of wireless sensor, operation mode of the wireless sensor, unique identifier of the wireless sensor, power level of wireless sensor, battery life of battery in wireless sensor, error information regarding the wireless sensor, operational time of the wireless sensor, operational time of machine or machine part, operational/run mode or sleep mode of the wireless sensor, the date and/or time associated with one or more of the measured/detected properties, etc.) without the need to 1) activate the battery of the wireless sensor, and/or wake the wireless sensor from sleep mode or deep sleep mode, 2) activate the wireless sensor, 3) place the wireless sensor into one or more sleep modes, 4) wake the wireless sensor from one or more sleep modes, and/or 5) cause the wireless sensor to transmit a signal.

In accordance with another and/or alternative non-limiting aspect of the present disclosure, the communications module of the wireless sensor includes a transmitter that is connected to the control circuitry (e.g., attached to the bottom side of the control circuitry, etc.). The transmitter transmits the associated machine data using a wireless protocol (e.g., Bluetooth, ZigBee, Z-Wave, 6LoWPAN, Thread, WiFi-ah (HaLow), WiFi, 2G, 3G, 4G, 5G, LTE Cat 0, 1, & 3, NB-IoT, NFC, RFID, SigFox, IR, ANT & ANT+, radio waves, etc.). In one non-limiting embodiment, the wireless protocol used by the wireless sensor is Bluetooth (short-wavelength UHF radio waves from 2.4 to 2.5 GHz (and all values and ranges therebetween)).

In accordance with another and/or alternative non-limiting aspect of the present disclosure, the communications module of the wireless sensor includes a transmitter that optionally wirelessly transmits information at certain time intervals and at different power levels. As such, for this non-limiting embodiment, the transmitter of the wireless sensor does not continuously transmit information that 1) consumes less power, 2) results in less interference with other wireless devices, and 3) improves security in that the transmitted information is more difficult to detect and steal. In one non-limiting embodiment, the transmitter of the wireless sensor transmits information at a high-power level (e.g., 10-30 dBm) for 0.1-10000 ms. (and all values and ranges therebetween) every 1-30 sec, (and all values and ranges therebetween). In one non-limiting configuration the transmitter of the wireless sensor transmits information at a high-power level of 16-20 dBm for 0.1-100 ms. every 4-15 sec. In one non-limiting embodiment, the transmitter of the wireless sensor transmits information at a low power level (e.g., 0.1-5 dBm) for 0.1-10000 ms. (and all values and ranges therebetween) every 1-30 sec. (and all values and ranges therebetween). In one non-limiting configuration, the transmitter of the wireless sensor transmits information at a low power level of 0.5-5 dBm for 0.1-100 ms. every 4-15 sec. In another non-limiting embodiment, the transmitter of the wireless sensor does not simultaneously transmit information at the low and high power level. In another non-limiting embodiment, the time between transmission of information at a high power level and the low power level is generally constant (e.g., 1-20 sec. and all values and ranges therebetween). In one non-limiting configuration, the transmitter of the wireless sensor transmits information at a low power level, waits for a set period of time (e.g., 5 sec., 10 sec, etc.) before transmitting information at the high power level, and then waits for a set period of time (e.g., 5 sec., 10 sec., etc.) before transmitting information at the low power level, and continues to repeat this interval of information transmission. As can be appreciated, the transmitter of the wireless sensor can be configured to transmit information at the low power level for multiple intervals (2-50 transmissions (and all values and ranges therebetween), etc.) before transmitting information at the high power level. Likewise, the transmitter of the wireless sensor can be configured to transmit information at the high power level for multiple times (2-50 transmissions (and all values and ranges therebetween), etc.) before transmitting information at the low power level. Generally, the time period for transmission of information at the high power level is about the same time period (±0.1-10% and all values and ranges therebetween) for the transmission of information at the low level; however, this is not required In accordance with another and/or alternative non-limiting aspect of the present disclosure, the communications module of the wireless sensor includes a transmitter that optionally wirelessly transmits information at one or more specific frequencies. As such, for this non-limiting embodiment, the transmitter of the wireless sensor does not transmit information at a wide bandwidth that 1) results in less interference with other wireless devices, and 2) improves security in that the transmitted information is more difficult to detect and steal. In one non-limiting embodiment, the transmitter transmits information at 1-10 specific frequencies (and all values and ranges therebetween). In one non-limiting configuration, the transmitter transmits information at 1-3 different specific frequencies wherein the frequencies are from 2.4 GHz to 2.5 GHz (and all values and ranges therebetween).

In accordance with another and/or alternative non-limiting aspect of the present disclosure, the communications module of the wireless sensor includes a transmitter that optionally transmits information via a beacon mode. Thus, information is transmitted by the wireless sensor to another device having a receiver (e.g., smartphone, tablet, laptop computer, computer, server, cloud system, mainframe, enterprise data warehouse, data lake, custom receiver display devices, data hubs, etc.) without having to first pair with the other device having the receiver. By using the beacon mode of information transmission, a device having a receiver can simultaneously receive information from a plurality of wireless sensors since the pairing with the individual wireless sensors is not required. Also, by eliminating the need for the wireless sensor to pair with another device that is receiving information from the wireless sensor, the data transmission time from the wireless sensor is reduced, thus increasing the battery life of the wireless sensor. In prior art wireless technology, (especially with regard to Bluetooth® technology), the wireless technology requires pairing of the transmission device with the receiver to ensure that the data was properly transmitted to the receiving device. However, such pairing takes additional time for the transmitting device and receiving device to confirm that a proper connection occurred before data is transmitted from the transmitting device. Such additional transmission time required by the transmitting device results in additional power, which can reduce the battery life of the transmitting device.

In accordance with another and/or alternative non-limiting aspect of the present disclosure, the communications module optionally includes one or more antenna connected to the control circuitry (e.g., attached to the top side of the control circuitry, attached to the bottom side of the control circuitry, etc.). The antenna provides the communicative link with the wireless sensor. The antenna can optionally receive instructions/information from an external source (e.g., smartphone, tablet, laptop computer, computer, server, cloud system, mainframe, enterprise data warehouse, data lake, custom receiver display devices, data hubs, etc.).

In accordance with another and/or alternative non-limiting aspect of the present disclosure, the communications module and/or sensor are optionally absent pressable buttons so as to improve the reliability and increase the life of the wireless sensor. The reduction and/or elimination of moving parts on the wireless sensor 1) reduces the incidence of failure of such moving parts over time due to use and/or exposure an environment having high and/or frequent vibrations, and/or 2) reduces the incidence of inadvertent or undesired movement of the moving parts (e.g., button being activated/deactivated when exposed to sudden movements and/or large vibrations, etc.). In one non-limiting embodiment, the wireless sensor is completely absent pressable buttons.

In accordance with another and/or alternative non-limiting aspect of the present disclosure, the wireless sensor optionally includes a sealed enclosure partially or fully enclosing the communications module. In one non-limiting embodiment, the sealed enclosure can partially or fully formed by an epoxy or urethane resin. In another non-limiting embodiment, the sealed enclosure can be partially or fully formed by a plastic or metal housing. In one non-limiting configuration, a resin (e.g., polyester resin, epoxy resin, polyurethane resin, silicon resin, etc.) is applied directly to one or more components of the communications module and/or top portion of the sensor to partially (e.g., 10-99% encapsulated and all values and ranges therebetween) or fully encapsulate the exterior surface of the communications module and/or top portion of the sensor with the resin. As can be appreciated, the resin can be applied to partially or fully encapsulate one or more interior surfaces of the communications module and/or top portion of the sensor. The resin (when cured) is formulated to form a protective shell about the communications module and/or top portion of the sensor. Generally, the resin has little or no electrical conductance so as to not interfere with the circuitry of the communications module and/or the sensor, and/or to not interfere with the electrical signals between the communications module and the sensor. Generally, the resin is formulated such that when the resin partially or fully covers the one or more antennas on the communications module, wireless signals can pass through the resin. As such, the resin is generally formulated to result in little or no detectable interference with wireless signals transmitted from the communications module and/or received by the communications module. Generally, the cured resin forms a hard protective shell about the communications module and/or top portion of the sensor. The resin (when cured) also functions as a rigid or generally rigid structure that locks one or more components of the communications module in a set position relative to one or more other components of the communications module and/or top portion of the sensor. In one non-limiting configuration, the resin partially or fully permanently bonds the battery of the communications module to the battery contacts of the communications module and/or permanently bonds the battery of the communications module in position relative to other components of the communications module. Also, when the communications module and/or sensor are exposed to large vibrational forces, the resin facilitates in 1) reduces damage to the components of the communications module and/or sensor, and/or 2) reduces signal failure or generation of false signal by the wireless sensor. Generally, a resin-containing housing (e.g., plastic housing, metal housing, etc.) is placed about the communications module and/or top portion of the sensor. In one non-limiting configuration, the housing is placed about the communications module and/or top portion of the sensor prior to the full curing of the resin. In such an assembly sequence, the uncured resin can contact the interior of the housing and bond to the housing to facilitate in securing the housing to the communications module and/or top portion of the sensor; however, this is not required. The housing (when used) reduces damage to the components of the communications module and/or sensor.

In accordance with another and/or alternative non-limiting aspect of the present disclosure, a plurality of connector pins is optionally used to mount the communications module on the sensor in spaced relation thereto. In one non-limiting embodiment, the one or more connector pins are configured to a) transmit information between the sensor and the communications module, b) provide a power connection between a power source (e.g., battery, etc.) and the sensor, c) provide a power connection between a power source (e.g., battery, etc.) and the communications module, and/or d) provide structural support and/or rigidity between the communications module and the sensor. In another non-limiting embodiment, the one or more connector pins are formed of an electrically conducting material (e.g., metal, conductive plastic, conductive ceramic, etc.). In another non-limiting embodiment, the plurality of connector pins can optionally create spacing between the sensor and the control circuitry of the communications module; however, this is not required. In one non-limiting configuration, such spacing enables other types of circuitry, a power source, etc., to be positioned between the sensor and the control circuitry of the communications module. In another non-limiting embodiment, the connection pins are solder or weld connected to the sensor and/or control circuitry of the communications module to create a robust connection between the sensor and the communications module.

In accordance with another and/or alternative non-limiting aspect of the present disclosure, the wireless sensor optionally includes a battery as a partial or full power source for the wireless sensor. In one non-limiting embodiment, the batter is mounted to the bottom side of the control circuitry of the communications module such that the battery is disposed between the sensor and the bottom side of the control circuitry the communications module; however, it can be appreciated that the battery can be located in other locations. The mounting of the battery between the sensor and the bottom side of the control circuitry of the communications module optionally protects the power source of the wireless sensor. In one non limiting embodiment, the battery is permanently connected to the control circuitry of the communications module (e.g., solder connected, adhesively connected, melted bond, etc.) to enable the wireless sensor to be exposed to high levels of vibration or shock without concern of the battery becoming disconnected from the control circuitry of the communications module. In another non-limiting embodiment, 70-100% (and all values and ranges therebetween) of the battery is located under the control circuitry board of the communications module. The location of the battery under the control circuitry board of the communications module optionally allows the antenna terminal to be located on the top side of the control circuitry board of the communications module so as to reduce signal interference from the battery; however, this is not required. By use of a dedicated battery to power the communications module and also optionally power the sensor, the size, height, and/or footprint of the wireless sensor can be reduced.

In accordance with another and/or alternative non-limiting aspect of the present disclosure, the communications module and sensor can optionally be concentrically aligned along a common axis. Such a configuration optionally reduces the size, height, and/or footprint of the wireless sensor.

In accordance with another and/or alternative non-limiting aspect of the present disclosure, the wireless sensor optionally includes one or more ports fluidly connected to the associated machine such that one or more properties of the associated machine or machine part can be measured at the port location and/or adjacent to the port location.

In accordance with another and/or alternative non-limiting aspect of the present disclosure, the control circuitry of the communications module can optionally be configured to preserve battery life by 1) deciding whether to broadcast data that has been previously collected, 2) deciding whether to energize one or more components to collect new data, 3) deciding whether to transmit data at a low or high power level, 4) waking one or more processors for data transmission and then placing the one or more processors back to sleep when no data is to be transmitted, 5) only periodically checking data from certain components at certain intervals, and/or 6) determining the periodic time intervals for the transmission of information. In one non-limiting embodiment, the control circuitry of the communications module determines what operating mode it is in before deciding whether to have collect or cause another component to cause collection of data from the sensor. For instance, if the wireless sensor is in sleep mode, the control circuitry of the communications module will not collect data from the sensor or cause another component to cause collection of data from the sensor, thus saving battery life. In one non-limiting embodiment, the control circuitry of the communications module can be configured to not rewrite memory about a value if the detected value has not changed. As such, power can be saved by eliminating unnecessary writing of data in memory. In another non-limiting embodiment, the control circuitry of the communications module can be configured to transmit data at low power (0.1-5 dBm and all values and ranges therebetween) and/or high power (e.g., 10-30 dBm and all values and ranges therebetween). In one non-limiting configuration, the control circuitry of the communications module is configured to transmit data at low power (0.1-0.5 dBm) and high power (16-20 dBm). The periodic transmission of data at low power results in battery power savings. Likewise, the periodic transmission of data at high power results in battery power savings. High power data/information transmission results in the receiver being able to receive data at greater distances as compared to low powered data/information transmission. As such, by periodically transmitting data/information at periodic intervals of low and high power, receivers located near the wireless sensor (0-30 ft. and all values and ranges therebetween) or at some farther location are able to wirelessly receive data/information from the wireless sensor while simultaneously preserving the battery life of the wireless sensor. In another non-limiting embodiment, the control circuitry of the communications module can be configured to only periodically access and transmit certain types of data/information so as to preserve battery life. For examples, battery voltage, battery life, signal strength, stored maximum data values, etc., are non-limiting examples of data values/information that do not need to be newly transmitted and/or that do not need to be newly checked/collected/stored each time data/information is transmitted from the wireless sensor. For example, for every second to tenth transmission of data/information from the wireless sensor, certain values will be checked/collected/stored and then transmitted. More important data (e.g., pressure, temperature, strokes, etc.) can be checked/collected/stored prior to each transmission of data/information from the wireless sensor or can be checked/collected/stored more frequently than other types of data. For instance, pressure and/or temperature values and/or other values can be checked/collected/stored prior to each transmission of data/information from the wireless sensor or checked/collected/stored every second or third time that data/information is transmitted from the wireless sensor, whereas battery voltage and/or battery life is checked/collected/stored every fourth or fifth time that data/information is transmitted from the wireless sensor. As can be appreciated, the wireless sensor can be programmed to newly check/collect/store certain types of data for transmission at certain times and/or transmission intervals so that the transmission of the types of data and/or the newness of the checked data is customized for what is needed in the various data transmissions. As such, the wireless sensor can transmit newly checked data for each wireless transmission, and/or different types of data can be transmitted in one or more wireless transmissions. For example, the battery voltage and/or battery life values can be checked/collected/stored every fourth or fifth time data/information, and such values can only be transmitted for every wireless transmission for every second, third fourth, etc., wireless transmission, whereas pressure and/or temperature values can be checked/collected/stored prior to each transmission or checked/collected/stored every second or third wireless transmission, but the pressure and/or temperature values are transmitted in each and/or every other wireless transmission. Such customized data checking, storing, collecting, and transmitting can be used to extend the battery life of the wireless sensor.

In accordance with another and/or alternative non-limiting aspect of the present disclosure, the wireless sensor optionally includes multiple sleep modes for preserving battery life. In one non-limiting embodiment, the wireless sensor includes a deep sleep mode, a sleep mode, and/or an operational/run mode.

In accordance with another and/or alternative non-limiting aspect of the present disclosure, when the wireless sensor is in the deep sleep mode, most or all of the microprocessor of the wireless sensor are optionally off to conserve battery power. In the deep sleep mode, the transmitter and/or radio, the sensor, accelerometer (when used), and any other device that consumes power is in the off or deactivate state so that little or no power is used while the wireless sensor is in the deep sleep more. In the deep sleep mode, the wireless sensor can be optionally configured to periodically wirelessly transmit a limited signal providing information on the presence of the wireless sensor for location or inventor purposes.

In accordance with another and/or alternative non-limiting aspect of the present disclosure, in the operational/run mode, the main microprocessor for the communications module is turned on. Once the main microprocessor is in the operational/run mode, the main microprocessor can activate one or more other components of the wireless sensor (e.g., sensor microprocessor, transmitter, receiver, accelerometer, gyroscope, clock, memory storage, etc.). If no activity is detected (e.g., no pressure change, no temperature change, no vibration detection, no movement detection, etc.), the microprocessor will remain in operational/run mode or go back to sleep mode to consume minimum power.

When the wireless sensor is in the sleep mode, a limited amount of information can optionally be configured to be wirelessly transmitted (e.g., power mode of wireless sensor, model/serial number of sensor, etc.) and the interval time for wireless transmission can be an extended time period (e.g., transmission every 30-250 sec. and all values and ranges therebetween); however, it can be appreciated that no information is transmitted from the wireless sensor while the wireless sensor is in the sleep mode. When the wireless sensor transmits information while in the sleep mode, the amount of information wirelessly transmitted is generally more than the amount of information wirelessly transmitted by the wireless sensor when in the deep sleep mode. Generally, the time intervals between wireless transmission of information by the wireless sensor when in the sleep mode are less than the time internals between wireless transmission of information by the wireless sensor when in the deep sleep mode.

When the wireless sensor is in the sleep mode and detects activity from one or more of the sensors on the wireless sensor (e.g., pressure change from pressure sensor, temperature change from the temperature sensor, vibration sensed from vibration sensor, movement sensed from accelerometer, movement sensed from gyroscope, activation of magnetic sensor or switch, receiving programming via programming/data port, receiving a wireless signal that is specifically directed to the wireless sensor, etc.), the wireless sensor can switch/enter into the operational/run mode.

In accordance with another and/or alternative non-limiting aspect of the present disclosure, if the wireless sensor is in the operational/run mode and no change is detected by one or more sensors (e.g., pressure change from pressure sensor, temperature change from the temperature sensor, vibration sensed from vibration sensor, movement sensed from accelerometer, movement sensed from gyroscope, etc.) after a certain period of time (e.g., 30 sec. to one day and all values and ranges therebetween), the wireless sensor can optionally enter into the sleep mode. As can be appreciated, the wireless sensor can optionally automatically enter the sleep mode after information is wirelessly transmitted while in the operational/run mode. For example, every 4-20 sec. (and all values and ranges therebetween), the wireless sensor can be programmed to automatically wake from the sleep mode and enter into the operational/run mode. When the wireless sensor is in the operational/run mode, the wireless sensor collects data/information from one or more of the sensors and then wirelessly transmits the data/information. Due to the ability of the wireless sensor to collect data from the one or more sensor in less than 1 second, the wireless sensor can enter into the operational/run mode from the sleep mode, collect data from one or more sensors, and wirelessly transmit data/information in less than 1-2 sec., and thereafter reenter the sleep mode. Such automatic switching of the wireless sensor between the sleep mode and the operational/run mode results in less energy consumption and extended battery life of the wireless sensor.

In accordance with another and/or alternative non-limiting aspect of the present disclosure, when in the operational/run mode, the wireless sensor will wirelessly transmit data as programmed. Generally, the amount of information wirelessly transmitted by the wireless sensor when in the operational/run mode is optionally more than the amount of information wirelessly transmitted by the wireless sensor when in the deep sleep mode and/or sleep mode.

In accordance with another and/or alternative non-limiting aspect of the present disclosure, the wireless sensor can optionally be configured to enter into a less active mode when 1) no change in activity from the one or more sensors is detected after a certain period of time, 2) upon receiving a certain wireless transmission, 3) upon receiving instructions via the program port, and/or 4) upon the magnetic sensor or switch being manually activated. In one non-limiting embodiment, the wireless sensor optionally moves from the operational/run mode to the sleep mode after no activity is detected from one or more of the sensors on the wireless sensor (e.g., pressure change from pressure sensor, temperature change from the temperature sensor, vibration sensed from vibration sensor, movement sensed from accelerometer, movement sensed from gyroscope, etc.). The time period of inactivity before the wireless sensor moves from the operational/run mode to the sleep mode is non-limiting (e.g., 1 min. to one week and all values and ranges therebetween). In another non-limiting embodiment, the wireless sensor optionally moves from the sleep mode to the deep sleep mode after no activity is detected from one or more of the sensors on the wireless sensor (e.g., pressure change from pressure sensor, temperature change from the temperature sensor, vibration sensed from vibration sensor, movement sensed from accelerometer, movement sensed from gyroscope, etc.). The time period of inactivity before the wireless sensor moves from the sleep mode to the deep sleep mode is non-limiting (e.g., 1 hour to 1 month and all values and ranges therebetween).

In accordance with another and/or alternative non-limiting aspect of the present disclosure, the wireless sensor optionally includes a magnetic sensor or switch (e.g., Hall effect sensor/switch) used to cause the wireless sensor to 1) move from a deep sleep mode to a sleep mode or operational/run mode, and/or 2) move into a deep sleep mode from the sleep mode or operational/run mode. In one non-limiting embodiment, the wireless sensor can only be taken out of deep sleep mode and/or can only be placed into deep sleep mode by use of a magnet or magnetic device manually moved in contact with or into close proximity to the magnetic sensor or switch. In another non-limiting embodiment, the wireless sensor can be placed in deep sleep mode by manually placing a magnet or magnetic device in close proximity to the wireless sensor (e.g., within 0-5 ft (and all values and ranges therebetween) of the wireless sensor, less than 2 ft. of the wireless sensor) for a certain period of time (e.g., 0.01-60 seconds (and all values and ranges therebetween), at least 5 sec., at least 10 sec., at least 20 sec., at least 30 sec., etc.). The requirement to both places a magnet or magnetic device in close proximity to the wireless sensor for some minimum period of time reduces or prevents inadvertently placing the wireless sensor in deep sleep mode. Prior to the wireless sensor going into the deep sleep mode, the wireless sensor can optionally broadcast one or more signals indicating over a certain period of time (e.g., 1-30 sec. (and all values and ranges therebetween), etc.) that the wireless sensor is about to enter into deep sleep mode. The broadcasting of the signal that the wireless sensor is in the process of entering into the deep sleep mode 1) provides status information about the wireless sensor, 2) provides information to a user/operator that the wireless sensor is in the process of or has been caused to enter the deep sleep mode, and/or 3) provides information to a user/operator that he/she is properly or is inadvertently causing the wireless sensor to enter the deep sleep mode.

In accordance with another and/or alternative non-limiting aspect of the present disclosure, the wireless sensor can optionally be programmed to collect new information from one or more of the sensors after every second, third, fourth, fifth, etc., time the wireless sensor moves from the sleep mode to the operational/run mode. As such, the wireless sensor conserves power and increases battery life by not obtaining new data from the one or more sensors each time the wireless sensor enters the operational/run mode. As can be appreciated, when the wireless sensor includes multiple sensors and/or multiple microprocessors, the wireless sensor can be programmed to selectively obtain new data from certain sensors and/or selectively activate certain microprocessors during a certain number of times that the wireless sensor enters the operational/run mode so that the wireless sensor conserves power and increases battery life by not obtaining new data from each of the sensors and/or by not activating each of the microprocessors each time the wireless sensor enters the operational/run mode.

In accordance with another and/or alternative non-limiting aspect of the present disclosure, the wireless sensor is optionally located in or integrated with one or more components of the associated machine or machine part. These one or more components can include: a piston, a side of a cylinder wall, a base of a cylinder, a safety release valve, or a port plug.

In accordance with another and/or alternative non-limiting aspect of the present disclosure, the communications module optionally includes a microprocessor configured to 1) be programmable, and/or 2) control the operation of the wireless sensor. The wireless sensor can be programed to 1) be associated with a certain model number, serial number, and/or ID code, 2) be associated with a model number and/or serial number of a certain machine or machine part, 3) change the types of information being transmitted and/or the time period/frequency that certain type of information is transmitted, 4) change the transmission wavelength frequency of information being transmitted from the wireless sensor, 5) enter/store operational ranges of parameters being measured (e.g., temperature range, pressure range, etc.), 6) set one or more of the sleep or operational/run mode settings, and/or 7) update firmware. The program information can be wirelessly sent to the wireless sensor or hardwired program into a program port of the wireless sensor.

In accordance with another and/or alternative non-limiting aspect of the present disclosure, the wireless sensor optionally includes transmission technology that provides information regarding the angle of arrival and/or departure of a wireless signal to/from the wireless sensor. This transmission technology can optionally be used to 1) locate the wireless sensor, 2) monitor movement of the wireless sensor (e.g., security purposes, obtaining information on a machine or machine part that is associated with the wireless sensor, etc.), 3) maintain, manage, and/or monitor inventory of one or more wireless sensors, 4) properly position the wireless sensor on a machine or machine part, and/or 5) properly position and/or properly orient a machine or machine part when installing the machine or machine part (e.g., the front face of the machine part is properly facing the front and not the rear during installation, the machine part is installed at the proper angle, the machine part is installed at the proper depth, etc.).

In accordance with another and/or alternative non-limiting aspect of the present disclosure, a plurality of wireless sensors is optionally included. Each wireless sensor in the plurality includes a communications module and a sensor. An external receiver can further be communicatively linked with the communications module of each wireless sensor. The external receiver can be configured to simultaneously receive the data transmitted by the communication module of each wireless sensor.

In accordance with another and/or alternative non-limiting aspect of the present disclosure, the wireless sensor optionally includes a first and second temperature sensors. In one non-limiting configuration, a first temperature sensor is located close to a location of a pressure sensor. The first pressure sensor thus measures/detects a temperature of the fluid that the pressure sensor is measuring/detecting for pressure levels. The second temperature sensor is spaced from the first pressure sensor (e.g. located in the control circuitry board, located on a circuit board, located on another component of the wireless sensor, etc.) and generally measures/detects ambient temperature about the wireless sensor.

In accordance with another and/or alternative non-limiting aspect of the present disclosure, the wireless sensor optionally has a data sampling rate from the sensor of greater than 1 data sample per sec. (e.g., 10-5000 data samples per sec. (and all values and ranges therebetween), etc.). Prior art sensors typically have a data sampling rate of no more than one data sample per sec. Such a low data rate can make it difficult, if not impossible, to provide accurate temperature and/or pressure profile data for a machine or machine part. The ability of the wireless sensor of the present disclosure to have a data sampling rate of greater than one data sample per second enables data to be collected and processed and provide accurate temperature and/or pressure profile data for a machine or machine part. In one non-limiting embodiment, the wireless sensor has a data sampling rate greater than 10 data samples per sec. In another non-limiting embodiment, the wireless sensor has a data sampling rate of greater than 100 data samples per sec. In another non-limiting embodiment, the wireless sensor has a data sampling rate of greater than 500 data samples per sec. In another non-limiting embodiment, the wireless sensor has a data sampling rate greater than 1000 data samples per sec. In another non-limiting embodiment, the wireless sensor has a data sampling rate greater than 1500 data samples per sec. When the wireless sensor transmits data at a time period that is less than the sampling rate, the transmitted data will include multiple data samples.

In accordance with another and/or alternative non-limiting aspect of the present disclosure, the wireless sensor optionally formats the data packets that are transmitted from the wireless sensor such that the data can be easily exported into a spreadsheet program (e.g., Excel®, Quattro Pro®, OpenOffice®, Google Sheets®, etc.

In accordance with another and/or alternative non-limiting aspect of the present disclosure, the wireless sensor optionally stores one or more (e.g., 1-100000 and all values and ranges therebetween) of the highest temperatures and/or pressures detected/measured during the operation of the machine or machine part. In one non-limiting embodiment, the wireless sensor stores at least two, typically at least five, more typically at least 10, and even more typically at least 100 of the highest temperatures and/or pressures detected/measured during the operation of the machine or machine part. This information can be periodically transmitted by the wireless transmitter and/or stored in memory and transmitted on demand by the wireless sensor.

In accordance with another and/or alternative non-limiting aspect of the present disclosure, the communications module of the wireless sensor is optionally configured to operate at a 2.7-5 volt input voltage (and all values and ranges therebetween), thereby allowing for a three-volt power source (e.g., battery) or other power source from 2.7-5 volts to power the communications module. The communications module of the wireless sensor can be configured to operate at less than 5 mA (e.g., 0.01-4.99 mA and all values and ranges therebetween), and typically less than 4 mA (e.g., about 3.5 mA) and generally at least 0.1 mA.

In accordance with another and/or alternative non-limiting aspect of the present disclosure, the communications module of the wireless sensor is optionally configured to form a digital interface with the sensor, thereby 1) eliminating analog corrections between the sensor and the communications module, and/or 2) increasing the speed of data transfer from the sensor to the communications module. The data transfer between the sensor and the communications module can be by I2C protocol; however, this is not required.

In accordance with another and/or alternative non-limiting aspect of the present disclosure, there is provided a smart device app for use with a smart device (e.g., smartphone, tablet, laptop computer, computer, server, cloud system, mainframe, enterprise data warehouse, data lake, custom receiver display devices, data hubs, etc.) to receive information from one or more wireless sensors and/or to transmit information to one or more wireless sensors. The smart device app can be used to a) collect data from one or more wireless sensors, b) collect data from one or more wireless sensors without having to first pair with such sensors, c) simultaneously detect signals from multiple sensors and simultaneously display information from multiple sensors, d) display signal strength, battery strength, battery life, sensor ID, machine or machine part model/serial number, last time information transmitted, number of strokes, duty time, seconds from last reading, pressure, temperature, sensor status, etc., e) change measurement units (US units, International Units, etc.) of the displayed readings, f) display predictive maintenance of the machine or machine part, g) locate a wireless sensor by access/receiving angle of arrival and departure of signals from the wireless sensor, g) display information about a wireless sensor in a certain portion of the screen of the smart device wherein the wireless sensor has had a hand magnet or other type of magnetic device positioned near the wireless sensor, h) color code or otherwise highlight display information about a wireless sensor in a certain portion of the screen of the smart device wherein the wireless sensor has had a hand magnet or other type of magnetic device positioned near wireless sensor, i) color code or otherwise highlight display information about a wireless sensor that 1) is close to the smart device, 2) is in deep sleep mode, 3) is in sleep mode, 4) is in operational/run mode, 5) is not properly functioning, 6) is about to stop operating due to a drained battery, 7) has received updated information from the one or more sensors of the wireless sensor, and/or 8) has received updated information from the one or more sensors of the wireless sensor that is outside a normal or desired value or range, j) connect to the Cloud and/or other type of device (e.g., data hub, network server, remote computer, etc.) for transmission of data to another computer and/or network, k) connect by RF, radio waves, Bluetooth®, etc., to a network and/or data hub for transmission of information to the network and/or data hub, l) simultaneously display information of multiple wireless sensors on the smart device display or a computer display, m) display information of one or more wireless sensors on the smart device display in closest proximity to the smart device, n) display information of a wireless sensors on the smart device display having a hand magnet or other type of magnetic device positioned near wireless sensor, and/or o) display information of one or more wireless sensors on the smart device display having the strongest signal being received by the smart device.

In accordance with another and/or alternative non-limiting aspect of the present disclosure, the smart device app displays information from a plurality of wireless sensors (e.g., information of 2-20 wireless sensors (and all values and ranges therebetween)) on a typical 4"×7" display screen.

In accordance with another and/or alternative non-limiting aspect of the present disclosure, the smart device app displays at least the following information about and/or associated with each of the wireless sensors: 1) strength of the signal received from the wireless sensor, 2) model number and/or serial number of wireless sensor, 3) model number and/or serial number of machine or machine part to which the wireless sensor is connected or associated with, 4) unique ID of the wireless sensor, 5) firmware version of wireless sensor, 6) battery voltage of wireless sensor, 7) battery life of wireless sensor, 7) time period since data from one or more sensors of the wireless sensor has been collected or scanned, 9) one or more measured/detected properties (e.g., pressure, temperature, number of strokes, etc.), 10) time of operation of machine or machine part, 11) date, 12) time, 13) facility or plant or factory name and/or address, and/or 14) type of sensed signal (e.g., digital signal, analog signal).

In accordance with another and/or alternative non-limiting aspect of the present disclosure, the smart device app can include a button and/or have another use feature (e.g., voice commands, etc.) that allows the user to a) restart or reboot the smart device app, b) refresh the smart device app, and/or 3) change the displayed measurement units.

In accordance with another and/or alternative non-limiting aspect of the present disclosure, the smart device app can highlight information in a certain color, font, etc., to provide information about one or more of the wireless sensors displayed in the smart device such as, but not limited to, 1) flash, change color, and/or change font when new data/information has been wirelessly transmitted by a wireless sensor, 2) flash, change color, and/or change font when a hand magnet or other type of magnetic device positioned near the wireless sensor causes the wireless sensor to wireless transmit information (e.g., on demand mode of wireless sensor), 3) flash, change color, and/or change font when a hand magnet or other type of magnetic device positioned near the wireless sensor causes the wireless sensor to enter into deep sleep mode, 4) flash, change color, and/or change font when a hand magnet or other type of magnetic device positioned near the wireless sensor causes the sensor to exit the deep sleep mode, 5) flash, change color, and/or change font when an error signal has been wirelessly transmitted by the wireless sensor, 6) flash, change color, and/or change font when a parameter sensed or detected by the wireless sensor exceeds a predefined value or range, 7) flash, change color, and/or change font when the battery life of the wireless sensor is near its end, and/or 8) flash, change color, and/or change font when the battery voltage level of the wireless sensor is above or below a predefined level. In one non-limiting embodiment the smart device app is caused to display information about wireless sensor, even if such wireless sensor was not being previously displayed on the display of the smart device when, but not limited to, 1) a hand magnet or other type of magnetic device positioned near wireless sensor causes the wireless sensor to wireless transmit information (e.g., on demand mode of wireless sensor), 2) a hand magnet or other type of magnetic device positioned near wireless sensor causes the wireless sensor to enter into deep sleep mode, 3) a hand magnet or other type of magnetic device positioned near the wireless sensor causes the sensor to exit the deep sleep mode, 4) an error signal has been wirelessly transmitted by the wireless sensor, 5) a parameter sensed or detected by the wireless sensor exceeds a predefined value or range, 6) the battery life of the wireless sensor is near its end, and/or 7) the battery voltage level of the wireless sensor is above or below a predefined level.

In accordance with another and/or alternative non-limiting aspect of the present disclosure, the data/information transmitted by the wireless sensor is not encrypted; however, it can be appreciated that the data/information transmitted by the wireless sensor is encrypted. In one non-limiting embodiment, the data/information transmitted by the wireless sensor is not encrypted, but is formatted in a specific way to be read and interpreted by a smart device app, computer, and/or data hub.

In accordance with another and/or alternative non-limiting aspect of the present disclosure, the data/information transmitted by the wireless sensor is transmitted in small data packets (e.g., 5-1000 byte packets and all values and ranges therebetween).

In accordance with another and/or alternative non-limiting aspect of the present disclosure, non-limiting advantages of the beacon (transmit only) technology used by the wireless sensor include:

longer battery life—radio transmitter stays on for short period of time (e.g., 1-10 milliseconds) and/or radio does not stay on to receive data;

multiple users can simultaneously gather sensor data—unlimited number of data receivers can be used simultaneously to receive data from one or more of the wireless sensors since no pairing is required;

multiple wireless sensors can send information—unlimited number of wireless sensors can send data simultaneously and the data from such wireless sensors can be simultaneously received by one or more users; and/or beacon signal feature allows for fast boot up time of the wireless sensor.

In accordance with another and/or alternative non-limiting aspect of the present disclosure, non-limiting advantages of the wireless sensor include:

quick data gathering—wireless sensor takes quick sampling rates;

no setup required to gather data—intuitive for users to operate;

fast readings—wireless sensor can read data from the one or more sensor at a rate of at least as fast as 0.7 milliseconds or as fast as at least 1500 sensor readings per second (and all values and ranges therebetween);

up to 1,000 characters per transmission or data packets can be transmitted by the wireless sensor;

quick data transmission—the time of each transmission of information/data can be no more than 10-50 milliseconds (and all values and ranges therebetween);

battery is hard wired and non-replaceable, thereby decreasing the size of the wireless sensor;

the battery is located in the middle of the wireless sensor so the antenna can be mounted on the top portion of wireless sensor to avoid or reduce signal interference;

the battery is located in the middle of the wireless sensor so the magnetic switch or sensor (e.g., Hall effect sensor) can be located on the outside on the top portion of wireless sensor; and/or dedicated battery allows for the wireless sensor components to be sealed in a housing and/or resin casing.

In accordance with another and/or alternative non-limiting aspect of the present disclosure, non-limiting advantages of the app and/or device that received information from the wireless sensor include:

does not require pairing with wireless sensor;

simultaneously displays information multiple wireless sensors;

connects to Cloud for transmission of data to a network;

verifies that the data received from one or more of the wireless sensors is within some predefined limit or range, and optionally generates a signal that data is within the predefined limit or range and/or that the data is outside of the predefined limit or range;

prioritizes sensor data on the screen based on the strongest/closest signal received from a wireless sensor; and/or gives alias names to each of the wireless sensors.

In one non-limiting object of the present disclosure, there is the provision of an improved wireless sensor for an associated machine or machine part.

In another and/or alternative non-limiting object of the present disclosure, there is the provision of an improved wireless sensor that includes a communications module that provides data related to the associated machine or machine part, and/or provides information about the wireless sensor.

In another and/or alternative non-limiting object of the present disclosure, there is the provision of an improved wireless sensor that includes a communications module having a control circuitry that controls the wireless sensor.

In another and/or alternative non-limiting object of the present disclosure, there is the provision of an improved wireless sensor that measures one or more properties related to the associated machine or machine part.

In another and/or alternative non-limiting object of the present disclosure, there is the provision of an improved wireless sensor that includes a communicative link with a communications module for outputting property data of the machine or machine part and/or data related to the wireless sensor.

In another and/or alternative non-limiting object of the present disclosure, there is the provision of an improved wireless sensor that includes a communications module mounted on the sensor and the sensor is optionally disposed under the bottom side of the control circuitry.

In another and/or alternative non-limiting object of the present disclosure, there is the provision of an improved wireless sensor wherein the one or more properties collected by the communications module of the wireless sensor can be 1) continuously transmitted wirelessly from the wireless sensor, and/or 2) periodically transmitted wirelessly from the wireless sensor.

In another and/or alternative non-limiting object of the present disclosure, there is the provision of an improved wireless sensor wherein the one or more properties measured by the wireless sensor includes the pressure of the associated machine or machine part, the temperature in the associated machine or machine part, the highest pressure measured/detected by the wireless sensor or a series of the highest pressures measured/detected by the wireless sensor, and/or the highest temperature measured/detected by the wireless sensor or a series of the highest temperatures measured/detected by the wireless sensor.

In another and/or alternative non-limiting object of the present disclosure, there is the provision of an improved wireless sensor wherein the one or more properties measured by the wireless sensor can be associated with a date and/or time.

In another and/or alternative non-limiting object of the present disclosure, there is the provision of an improved wireless sensor that stores information in its memory.

In another and/or alternative non-limiting object of the present disclosure, there is the provision of an improved wireless sensor wherein the data stored in memory is securely locked in memory.

In another and/or alternative non-limiting object of the present disclosure, there is the provision of an improved wireless sensor in which the data is securely locked in memory in the wireless sensor and can only be accessed by use of a security code/password or by other security protocols. If one or more attempts to access the secured data occur without use of the security code/password or by unauthorized security protocols, the stored data is optionally permanently erased from memory.

In another and/or alternative non-limiting object of the present disclosure, there is the provision of an improved wireless sensor that "burns" data in memory such that if there is a power failure to the wireless sensor, the "burned" data can be again accessed once power is restored.

In another and/or alternative non-limiting object of the present disclosure, there is the provision of an improved wireless sensor wherein the communications module further includes a motion sensor.

In another and/or alternative non-limiting object of the present disclosure, there is the provision of an improved wireless sensor that includes a magnetic sensor/switch such as, but not limited to, a Hall effect sensor/switch.

In another and/or alternative non-limiting object of the present disclosure, there is the provision of an improved wireless sensor that includes a transmitter.

In another and/or alternative non-limiting object of the present disclosure, there is the provision of an improved wireless sensor that includes one or more antenna, wherein the antenna can transmit and/or receive data.

In another and/or alternative non-limiting object of the present disclosure, there is the provision of an improved wireless sensor that includes a sealed enclosure partially or fully enclosing the communications module.

In another and/or alternative non-limiting object of the present disclosure, there is the provision of an improved wireless sensor that includes a plurality of connector pins with which to mount the communications module to the sensor, wherein the one or more connector pins are configured to a) transmit information between the sensor and the communications module, b) provide a power connection between a power source and the sensor, c) provide a power connection between a power source and the communications module, and/or d) provide structural support and/or rigidity between the communications module and the sensor.

In another and/or alternative non-limiting object of the present disclosure, there is the provision of an improved wireless sensor that includes a plurality of connector pins that are formed of an electrically-conducting material.

In another and/or alternative non-limiting object of the present disclosure, there is the provision of an improved wireless sensor that includes a plurality of connector pins to create spacing between the sensor and the control circuitry.

In another and/or alternative non-limiting object of the present disclosure, there is the provision of an improved wireless sensor that includes a plurality of connector pins that are solder or weld connected to the sensor to create a robust connection between the sensor and the communications module.

In another and/or alternative non-limiting object of the present disclosure, there is the provision of an improved wireless sensor that includes a battery as a partial or full power source for the wireless sensor.

In another and/or alternative non-limiting object of the present disclosure, there is the provision of an improved wireless sensor wherein the battery is permanently connected to the control circuitry to enable the wireless sensor to be exposed to high levels of vibration or shock without concern of the battery becoming disconnected from the control circuitry.

In another and/or alternative non-limiting object of the present disclosure, there is the provision of an improved wireless sensor that includes a storage mode, a running mode, and/or an on-demand mode.

In another and/or alternative non-limiting object of the present disclosure, there is the provision of an improved wireless sensor that is located in or integrated with one or more components of the associated machine or machine part.

In another and/or alternative non-limiting object of the present disclosure, there is the provision of an improved wireless sensor that includes a microprocessor configured to 1) be programmable, and/or 2) control the operation of the wireless sensor.

In another and/or alternative non-limiting object of the present disclosure, there is the provision of an improved wireless sensor that includes a first and second temperature sensor, wherein one temperature sensor measures/detects a temperature of fluid in a machine or machine part and the other temperature sensor measures/detects ambient temperature about the wireless sensor.

In another and/or alternative non-limiting object of the present disclosure, there is the provision of an improved wireless sensor having a data sampling rate from the sensor of greater than one data sample per second.

In another and/or alternative non-limiting object of the present disclosure, there is the provision of an improved wireless sensor that includes multiple power and/or sleep modes.

In another and/or alternative non-limiting object of the present disclosure, there is the provision of an improved wireless sensor that stores one or more of the highest temperatures and/or pressures detected/measured during the operation of the machine or machine part.

In another and/or alternative non-limiting object of the present disclosure, there is the provision of an improved wireless sensor that is configured to operate at a 2.7-5 volts input voltage, thereby allowing for a three-volt power source to power the communications module.

In another and/or alternative non-limiting object of the present disclosure, there is the provision of an improved wireless sensor that operates at less than 5 mA.

In another and/or alternative non-limiting object of the present disclosure, there is the provision of an improved wireless sensor configured to form a digital interface with the sensor, thereby eliminating analog corrections between the sensor and the communications module.

In another and/or alternative non-limiting object of the present disclosure, there is the provision of an improved wireless sensor that comprises a) a communications module providing data related to the associated machine or machine part and including a control circuitry that controls the wireless sensor, the control circuitry having a top side and a bottom side; b) a sensor measuring a property related to the associated machine or machine part and including a communicative link with the control circuitry for outputting property data, wherein the communications module is mounted on the sensor and the sensor is disposed under the bottom side of the control circuitry; and, c) wherein the property measured by the sensor is included in the data provided by the communications module and the control circuitry instructs the communications module to provide the data at specified intervals of time.

In another and/or alternative non-limiting object of the present disclosure, there is the provision of an improved wireless sensor wherein the communications module comprises a motion sensor attached to the bottom side of the control circuitry that monitors data related to movement of the associated machine or machine part. The movement data monitored by the motion sensor can be included in the data provided by the communications module. The movement data of the associated machine includes data related to at least one of a stroke count, a time period for a stroke, presence of vibration, change in rotation, active operational time, and multi-directional change in movement. The control circuitry controls the monitoring of movement data by the motion sensor, and the motion sensor includes at least one of an accelerometer or gyroscope.

In another and/or alternative non-limiting object of the present disclosure, there is the provision of an improved wireless sensor wherein the communications module comprises a magnetic sensor. The magnetic sensor can optionally be connected/attached to the top side of the control circuitry and can optionally be configured to facilitate in the activation and/or deactivation of the wireless sensor.

In another and/or alternative non-limiting object of the present disclosure, there is the provision of an improved wireless sensor wherein the magnetic sensor can be optionally configured to instruct the communications module to change the interval of time at which the communications module provides the associated machine data. The magnetic sensor can optionally be a Hall effect sensor.

In another and/or alternative non-limiting object of the present disclosure, the communications module includes a transmitter attached to the control circuitry. The transmitter transmits the associated machine data using a wireless protocol, which includes Bluetooth® 5.0.

In another and/or alternative non-limiting object of the present disclosure, the communications module includes an antenna attached to the control circuitry. The antenna is configured to provide a communicative link between the wireless sensor and an external computing device accessed by an operator.

In another and/or alternative non-limiting object of the present disclosure, a sealed enclosure is optionally included that houses the communications module and the sensor.

In another and/or alternative non-limiting object of the present disclosure, a plurality of connector pins is optionally used to mount the communications module on the sensor in spaced relation thereto.

In another and/or alternative non-limiting object of the present disclosure, a battery is optionally mounted to the bottom side of the control circuitry such that the battery is disposed between the sensor and the bottom side of the control circuitry.

In another and/or alternative non-limiting object of the present disclosure, the communications module and sensor are concentrically aligned along a common axis.

In another and/or alternative non-limiting object of the present disclosure, the sensor further comprises a port fluidly connected to the associated machine such that the property change of the associated machine is measured at a location adjacent to the port.

In another and/or alternative non-limiting object of the present disclosure, the communications module further provides information related to the wireless sensor. This information can include at least one of a signal strength of the communications module, a unique identifier of the wireless sensor, a model or serial number of the wireless sensor, an operating mode of the wireless sensor, a battery life of the wireless sensor, or a location of the wireless sensor.

In another and/or alternative non-limiting object of the present disclosure, the wireless sensor further includes a storage mode, a running mode, and an on-demand mode.

In another and/or alternative non-limiting object of the present disclosure, the wireless sensor is located in or integrated with one or more components of the associated machine.

In another and/or alternative non-limiting object of the present disclosure, the wireless sensor includes control circuitry that includes a microprocessor configured to program and control the wireless sensor.

In another and/or alternative non-limiting object of the present disclosure, the wireless sensor includes a motion sensor, wherein the motion sensor is attached to the bottom side of the control circuitry. The motion sensor monitors data related to movement of the associated machine, and the microprocessor is configured to correlate the property change data output by the sensor to the movement data monitored by the motion sensor.

In another and/or alternative non-limiting object of the present disclosure, a memory is included which is attached to the control circuitry. The memory stores the associated machine data.

In another and/or alternative non-limiting object of the present disclosure, a plurality of wireless sensors is included. Each wireless sensor in the plurality includes a communications module and a property change sensor. An external receiver can further be communicatively linked with the communications module of each wireless sensor in the plurality. The external receiver simultaneously receives the associated machine data provided by the communications module of each wireless sensor in the plurality.

In another and/or alternative non-limiting object of the present disclosure, the communications module of the wireless sensor includes a transmitter that transmits information via a beacon mode.

In another and/or alternative non-limiting object of the present disclosure, the communications module of the wireless sensor includes a transmitter that wirelessly transmits information via a beacon mode to another device having a receiver without having to first pair with the other device.

In another and/or alternative non-limiting object of the present disclosure, the communications module of the wireless sensor includes a transmitter that wirelessly transmits information via a beacon mode to another device having a receiver without having to first pair with the other device, thereby enabling one or more other devices having a receiver to simultaneously receive information from a plurality of wireless sensors.

In another and/or alternative non-limiting object of the present disclosure, the communications module of the wireless sensor includes a transmitter that wirelessly transmits information via a beacon mode to another device having a receiver without having to first pair with the other device, thereby conserving battery life.

In another and/or alternative non-limiting object of the present disclosure, there is provided a smart device app for use with a smart device receive information from one or more wireless sensors and/or to transmit information to one or more wireless sensors.

In another and/or alternative non-limiting object of the present disclosure, there is provided a smart device app for use with a smart device that can be used to receive information from one or more wireless sensors and/or to transmit information to one or more wireless sensors, and wherein the smart device app can a) collect data from one or more wireless sensors, b) collect data from one or more wireless sensors without having to first pair with such sensors, c) simultaneously detect signals from multiple sensors and simultaneously display information from multiple sensors, d) display signal strength, battery strength, battery life, sensor ID, machine or machine part model/serial number, last time information transmitted, number of strokes, duty time, seconds from last reading, pressure, temperature, sensor status, etc., e) change measurement units (US units, International Units, etc.) of the displayed readings, f) display predictive maintenance of the machine or machine part, g) locate a wireless sensor by access/receiving angle of arrival and departure of signals from the wireless sensor, h) display information about a wireless sensor in a certain portion of the screen of the smart device wherein the wireless sensor has had a hand magnet or other type of magnetic device positioned near wireless sensor, i) color code or otherwise highlight display information about a wireless sensor in a certain portion of the screen of the smart device wherein the wireless sensor has had a hand magnet or other type of magnetic device positioned near wireless sensor, j) color code or otherwise highlight display information about a wireless sensor that 1) is close to the smart device, 2) is in deep sleep mode, 3) is in sleep mode, 4) is in operational/run mode, 5) is not properly functioning, 6) is about to stop operating due to a drained battery, 7) has received updated information from the one or more sensors of the wireless sensor, and/or 8) has received updated information from the one or more sensors of the wireless sensor that is outside a normal or desired value or range, k) connect to the Cloud and/or other type of device (e.g., data hub, network server, remote computer, etc.) for transmission of data to another computer and/or network, l) connect by RF, radio waves, Bluetooth®, etc., to a network and/or data hub for transmission of information to the network and/or data hub, m) simultaneously display information of multiple wireless sensors on the smart device display or a computer display, n) display information of one or more wireless sensors on the smart device display that are in closest proximity to the smart device, o) display information of a wireless sensors on the smart device display that has had a hand magnet or other type of magnetic device positioned near the wireless sensor, and/or p) display information of one or more wireless sensors on the smart device display having the strongest signal being received by the smart device.

In another and/or alternative non-limiting object of the present disclosure, there is provided a smart device app for use with a smart device that can simultaneously display information from a plurality of wireless sensors.

In another and/or alternative non-limiting object of the present disclosure, there is provided a smart device app for use with a smart device to receive information from one or more wireless sensors and/or to transmit information to one or more wireless sensors wherein the smart device app can highlight information in a certain color, font, etc., to provide information about one or more of the wireless sensors displayed in the smart device such as, but not limited to, 1) flash, change color, and/or change font when new data/information is wirelessly transmitted by a wireless sensor, 2) flash, change color, and/or change font when a hand magnet or other type of magnetic device positioned near the wireless sensor causes the wireless sensor to wireless transmit information (e.g., on demand mode of wireless sensor), 3) flash, change color, and/or change font when a hand magnet or other type of magnetic device positioned near the wireless sensor causes the wireless sensor to enter into deep sleep mode, 4) flash, change color, and/or change font when a hand magnet or other type of magnetic device positioned near the wireless sensor causes the sensor to exit the deep sleep mode, 5) flash, change color, and/or change font when an error signal is wirelessly transmitted by the wireless sensor, 6) flash, change color, and/or change font when a parameter sensed or detected by the wireless sensor exceeds a predefined value or range, 7) flash, change color, and/or change font when the battery life of the wireless sensor is near its end, and/or 8) flash, change color, and/or change font when the battery voltage level of the wireless sensor is above or below a predefined level.

In another and/or alternative non-limiting object of the present disclosure, there is provided a smart device app for use with a smart device to receive information from one or more wireless sensors and/or to transmit information to one or more wireless sensors wherein the smart device app can connected to one or more other smart devices to transmit data received by the smart device to one or more other smart devices.

In another and/or alternative non-limiting object of the present disclosure, there is provided a smart device app for use with a smart device to receive information from one or more wireless sensors and/or to transmit information to one or more wireless sensors wherein the smart device app can be used to 1) verify the data received from one or more of the wireless sensors is within some predefined limit or range, 2) generate a signal that the received data is within the predefined limit or range and/or that the data is outside of the predefined limit or range, 3) prioritize sensor data on the screen based on the strongest/closest signal received from a wireless sensor, and/or 4) give alias names to each of the wireless sensors.

In another and/or alternative non-limiting object of the present disclosure, there is provided a smart device app for use with a smart device that displays certain wireless sensors on the smart device display based on 1) strongest signal strength received from wireless sensor, 2) more recently updated data transmitted by wireless sensor, 3) an error being received from the wireless sensor, 4) data received from the wireless sensor is outside a predefined parameter, 5) the wireless sensor is about to enter and/or has entered a power down mode, and/or 6) a magnetic device has been moved into close proximity to the wireless sensor.

In another and/or alternative non-limiting object of the present disclosure, there is provided a smart device app for use with a smart device that highlights data about a wireless sensor being displayed on the smart device when 1) new data is received from the wireless sensor, 2) an error has been received from the wireless sensor, 3) data received from the wireless sensor is outside a predefined parameter, 4) the wireless sensor is about to enter and/or has entered a power down mode, and/or 5) a magnetic device has been moved into close proximity to the wireless sensor.

In another and/or alternative non-limiting object of the present disclosure, there is provided a smart device app for use with a smart device causes highlighted data of a wireless sensor to be displayed on the smart device if data from said wireless sensor was not being displayed on said smart device prior to said data being highlighted.

In another and/or alternative non-limiting object of the present disclosure, there is provided a smart device app for use with a smart device that can transmit data received from one or more wireless sensors to another smart device.

In another and/or alternative non-limiting object of the present disclosure, there is provided a smart device app for use with a smart device that can receive data from another smart device about one or more wireless sensors wherein the other smart device has received data from one or more wireless sensors and/or wherein other smart device has receive data from another smart device that has received data about one or more wireless sensors.

These and other objects and advantages will become apparent from the discussion of the distinction between the disclosure and the prior art and when considering the preferred embodiment shown in the accompanying drawings.

BRIEF DESCRIPTION OF THE DRAWINGS

Reference may now be made to the drawings, which illustrate various embodiments that the disclosure may take in physical form and in certain parts and arrangement of parts wherein:

FIG. 1 is an illustration according to one non-limiting embodiment of the present disclosure which illustrates an exemplary wireless sensor having a communications module mounted on a pressure/temperature sensor;

FIG. 4 is an illustration of a top side control circuitry of the communications module from the wireless sensor of FIG. 1;

FIG. 5 is an illustration of a bottom side control circuitry of the communications module from the wireless sensor of FIG. 1;

FIG. 12 is an illustration according to one non-limiting embodiment of the present disclosure which illustrates a first exemplary machine component suitable for integration with a wireless sensor made in accordance with the present disclosure;

FIG. 13 is an illustration according to one non-limiting embodiment of the present disclosure which illustrates a second exemplary machine component suitable for integration with a wireless sensor made in accordance with the present disclosure;

FIG. 14 is an illustration according to one non-limiting embodiment of the present disclosure which illustrates a third exemplary machine component suitable for integration with a wireless sensor made in accordance with the present disclosure;

FIG. 15A is an illustration according to one non-limiting embodiment of the present disclosure which illustrates a fourth exemplary machine component suitable for integration with a wireless sensor made in accordance with the present disclosure;

FIG. 15B is a close-up detail view of the fourth exemplary machine component of FIG. 15A which is suitable for integration with the wireless sensor;

FIG. 16 is an illustration according to one non-limiting embodiment of the present disclosure which illustrates a fifth exemplary machine component suitable for integration with a wireless sensor made in accordance with the present disclosure; and, FIGS. 17-21 illustrate several non-limiting displays from a smart device, wherein the smart device has a loaded app loaded that is configured to receive and display information from one or more wireless sensors.

DETAILED DESCRIPTION OF NON-LIMITING EMBODIMENTS

Figure 3:
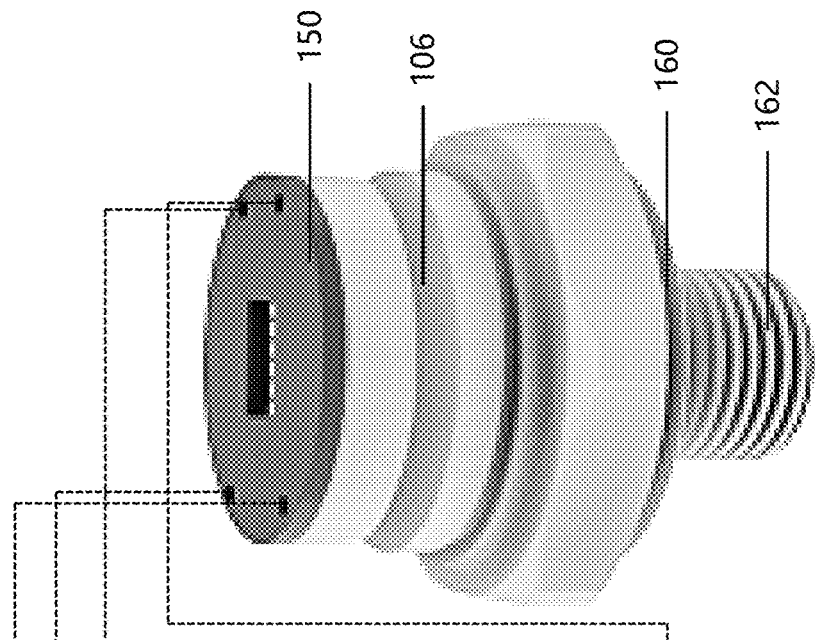
FIG. 3 is an additional view of the wireless sensor of FIG. 1 which illustrates the pressure/temperature sensor separate from the communications module.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any unavoidable impurities that might result therefrom, and excludes other ingredients/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "about" and "approximately" can be used to include any numerical value that can vary without changing the basic function of that value. When used with a range, "about" and "approximately" also disclose the range defined by the absolute values of the two endpoints, e.g. "about 2 to about 4" also discloses the range "from 2 to 4." Generally, the terms "about" and "approximately" may refer to plus or minus 10% of the indicated number.

Various non-limiting embodiments of the presently disclosed subject matter described herein will be better understood when read in conjunction FIGS. 1-16. The showings of FIGS. 1-16 are for the purpose of illustrating non-limiting embodiments of the disclosure only and not for the purpose of limiting the same. To the extent the drawings illustrate diagrams with functional blocks of various components, the functional blocks are not necessarily indicative of the division between hardware and/or circuitry. Thus, for example, one or more of the functional blocks (e.g., processors, controllers, or memories) may be implemented in a single piece of hardware (for example, a general purpose signal processor or random access memory, hard disk, or the like) or multiple pieces of hardware. Similarly, programs may be implemented as stand-alone programs, incorporated as subroutines in an operating system, included as functions in an installed software package, and the like. It should be understood that the various embodiments are not limited to the arrangements and instrumentality of the functional blocks shown in the drawings.

The devices and systems described herein can include or represent hardware and associated instructions (e.g., software stored on a tangible and/or non-transitory computer readable storage medium, such as a computer hard drive, ROM, RAM, or the like) that perform the operations described herein. The hardware may include electronic circuits that include and/or are connected to one or more logic-based devices, such as microprocessors, processors, controllers, or the like. These devices may be off-the-shelf devices that perform the operations described herein from the instructions described above. Additionally, or alternatively, one or more of these devices may be hardwired with logic circuits to perform these operations based on the hardwired logic. The devices and systems may represent the hardware that operates based on software or hardwired instructions, the software that directs hardware to perform the operations, or a combination thereof.

With reference to FIGS. 1-11, a wireless sensor 100 formed in accordance with an exemplary embodiment of the present disclosure is illustrated and pictured. Wireless sensor 100 is generally configured for use in a component of an associated machine or machine part (not shown); however, such a configuration is non-limiting. For example, wireless sensor 100 can be used with a spring, hydraulic cylinder, strut, or any other device that it would be beneficial to measure temperature and/or pressure.

Moreover, wireless sensor 100 is generally composed of two primary components, namely a sensor 106 which measures/detects one or more properties such as, but not limited to, pressure and/or temperature, in the associated machine or machine part, and a communications module 102 which collects, stores, and/or transmits data received from sensor 106. However, such a configuration is non-limiting. As discussed in further detail below, communications module 102 is generally mounted on top of sensor 106.

Communications module 102 includes a control circuitry 104 responsible for controlling the overall operation of wireless sensor 100. Control circuitry 104 is generally configured to enable communications module 102 to collect, store, and/or transmit data obtained from sensor 106 at specified intervals of time (e.g., continuously transmit data, transmit data every 0.001-3600 sec. (and all values and ranges therebetween), 10 sec., etc.). Control circuitry 104 is generally considered a hardware component of wireless sensor 100, where electronic circuits include and/or connect one or more logic-based devices, such as microprocessors, processors, controllers, or the like. Control circuitry 104 may also include electronic circuits including and/or connecting one or more RAM or ROM memories, logic and timing circuitry, state machine circuitry, input/output (I/O) circuitry, and the like. Moreover, control circuitry 104 has a top side 120 and a bottom side 130. The various hardware components of exemplary communications module 102 can be disposed on either the top or bottom sides 120, 130 of control circuitry 104 and can be connected to be in communication with one or more of the components of control circuitry 104.

For example, as best seen in FIG. 4, the programming/data port 122, the optional magnetic sensor/switch 124, and antenna 126 hardware components of communications module 102 are disposed on and communicatively optionally attached to top side 120 of control circuitry 104. Programming/data port 122 permits a communicative link with an external computing device (not shown) such that the various hardware components of wireless sensor 100, including communications module 102, can be programmed with logic enabling each component to carry out specific tasks. However, it should be understood that programming/data port 122 can also be used for functions which require a communicative link with control circuitry wireless sensor 100 such as, but not limited to, debugging. In one non-limiting configuration, wireless sensor 100 can be configured to only receive information via programming/data port 122. In such a configuration, wireless sensor 100 is unable to be programmed via a wireless signal.

The optional magnetic sensor/switch 124 of communications module 102 is generally disposed on and communicatively attached to top side 120 of control circuitry 104. Magnetic sensor/switch 124 can optionally be configured to 1) activate wireless sensor 100 when the magnetic sensor detects a magnetic force from an associated magnet, 2) cause the wireless sensor 100 to enter into a sleep mode, 2) cause wireless sensor 100 to enter into a deep sleep mode, 4) deactivate wireless sensor 100, and/or 5) cause wireless sensor 100 to send a signal that can be used by another device (e.g., smart device, etc.) to identify/highlight, etc., the information from wireless sensor 100 on the other device. The associated magnet may be included in an external computing device accessed by an operator/user, such as an associated smartphone. As discussed in greater detail below, magnetic sensor/switch 124 may have other or additional functions. The optional magnetic sensor/switch 124 can enable a magnet to give the user/operator control over wireless sensor 100. In some particular non-limiting embodiments, magnetic sensor/switch 124 is a Hall effect sensor known in the art. These Hall effect sensors, such as magnetic sensor/switch 124, can advantageously function even when fully sealed within an associated enclosure (e.g., enclosure 114 in FIG. 11) and integrated within a component of an associated machine or machine part.

Antenna 126 of communications module 102 is generally disposed on and communicatively attached to top side 120 of control circuitry 104. Antenna 126 is generally included to provide a wireless communicative link for wireless sensor 100. Antenna 126 is configured to receive and/or transmit information, data, instructions, etc., between communications module 102 and another external electronic device (e.g., smartphone, tablet, laptop computer, computer, server, cloud system, mainframe, enterprise data warehouse, data lake, custom receiver display devices, data hubs, etc.).

As best seen in FIG. 5, a radio or transmitter 108 and an optional motion sensor 132 of communications module 102 are disposed on and communicatively attached to bottom side 130 of control circuitry 104. Radio or transmitter 108 is generally configured to transmit data measured/detected or recorded from the machine associated with wireless sensor 100. In addition, radio or transmitter 108 can be configured to transmit information related to wireless sensor 100 itself. This information includes, but is not limited to, one or more properties of the machine or machine part and/or data related to the wireless sensor (e.g., model number of machine/machine part, model number of wireless sensor, firmware version used in wireless sensor, serial number of machine/machine part, serial number of wireless sensor, pressure information, temperature information, wireless sensor location information, location information of the machine or machine part, movement information of the wireless sensor, movement information of the machine or machine part, battery status/level information of wireless sensor, voltage information of wireless sensor, low voltage information of wireless sensor, signal strength information of wireless sensor, operation mode of the wireless sensor, unique identifier of the wireless sensor, power level of wireless sensor, battery life of battery in wireless sensor, error information regarding the wireless sensor, operational time of the wireless sensor, operational time of machine or machine part, operational/run mode or sleep mode of the wireless sensor, highest pressure measured/detected by the wireless sensor or a series of the highest pressures measured/detected by the wireless sensor, highest temperature measured/detected by the wireless sensor or a series of the highest temperatures measured/detected by the wireless sensor, date and/or time associated with one or more of the measured/detected properties, number of times a measured/detected property of the machine or machine part falls outside a set parameter or parameter range, number of times a measured/detected property of the machine or machine part meets a set parameter or falls within a parameter range, vibration level information, duty time of machine or machine part, and/or number of times the wireless sensor wirelessly transmitted information during a certain time period. The information related to wireless sensor 100 can optionally be included as part of the data which communications module 102 provides via transmission by transmitter 108.

The location of the wireless device can optionally be determined by using the magnetic sensor 124 discussed above. For example, numerous machine components each having the integrated wireless sensor of the present disclosure may be stored in inventory. To locate a particular sensor/machine component, a magnet is waved over the inventory and is sensed by a corresponding magnetic sensor, thereby activating the wireless sensor. Once activated, control circuitry 104 can instruct the transmitter 108 of the communications module 102 to transmit identifying information of the activated device. As discussed in more detail below, when a magnet is brought into close proximity to wireless sensor 100, magnetic sensor/switch 124 can cause wireless sensor 100 to transmit a signal that can be received by an app on a smart device and/or received in other ways on a smart device such that wireless sensor 100 can be identified as wireless sensor 100 that the magnet is located in close proximity thereto.

Transmitter 108 uses a wireless protocol which, when instructed by the control circuitry 104, permits communications module 102 to provide the associated machine data and/or wireless sensor information continuously or at specified intervals of time. The wireless protocol utilized by transmitter 108 can be "transmit only" or beacon-type protocol; however, other transmit protocols can be used (e.g., Bluetooth pairing, WiFi pairing, Zigbee pairing, Z-Wave pairing, 6LoWPAN pairing, RFID pairing, Cellular pairing, NB-IOT pairing, 2G pairing, 3G pairing, 4G pairing, 5G pairing, NFC pairing, LoRaWAN pairing, LTE-M pairing, etc.). In some particular non-limiting embodiments, transmitter 108 is a Bluetooth® radio, and the wireless protocol used by transmitter 108 is Bluetooth®.

When using a beacon-type protocol, power consumption of wireless sensor 100 is reduced, thereby increasing the battery life of wireless sensor 100. In addition, compared to a traditional Bluetooth® wireless protocol, the beacon-type wireless protocol eliminates the need for time consuming and complex "pairing" processes with associated receivers or external computing devices, such as smartphone, tablet, laptop computer, computer, server, cloud system, mainframe, enterprise data warehouse, data lake, custom receiver display devices, data hubs, etc., and the like. Furthermore, traditional Bluetooth® wireless protocols allow pairing of only one sensor device and one receiver device at a time. In contrast, the beacon-type protocol permits a theoretically infinite number of sensor devices to transmit associated machine data to any number of corresponding receiver devices (e.g., smartphone, tablet, laptop computer, computer, server, cloud system, mainframe, enterprise data warehouse, data lake, custom receiver display devices, data hubs, etc.), all of which can receive and access the data from every transmitting sensor device. Moreover, since multiple associated receiver or external computing devices can receive the beacon-type wireless protocol transmitted by transmitter 108, ease of access to the transmitted information is increased for multiple users/operators. Also, since beacon-type wireless protocol does not require pairing prior to receiving the information, multiple users can simultaneously receive information from wireless sensor 100.

In some other non-limiting embodiments, the wireless protocol used by the transmitter 108 is Bluetooth®. Bluetooth® can provide the angle of arrival and angle of departure technologies that establish a standardized framework for delivering precise, localized information to location services including asset tracking, indoor navigation, and mobile engagement. This transmission technology can optionally be used to 1) locate the wireless sensor, 2) monitor movement of the wireless sensor (e.g., security purposes, obtaining information on a machine or machine part that is associated with the wireless sensor, etc.), 3) maintain, manage, and/or monitor inventory of one or more wireless sensors, 4) properly position the wireless sensor on a machine or machine part, and/or 5) properly position and/or properly orient a machine or machine part when installing the machine or machine part (e.g., the front face of the machine part is properly facing the front and not the rear during installation, the machine part is installed at the proper angle, the machine part is installed at the proper depth, etc.).

Motion sensor 132 is generally disposed on and communicatively attached to bottom side 130 of control circuitry 104. Motion sensor 132 is configured to monitor, measure, record, etc., data related to movement (e.g., vibration, etc.) of the machine associated with wireless sensor 100. The movement data monitored by motion sensor 132 can be included as part of the data which communications module 102 continuously provides via transmission by transmitter 108. When instructed by control circuitry 104, motion sensor 132 senses and monitors different types of movement in the associated machine including, but not limited to, the stroke count of one or more components in the associated machine (e.g., one or more cylinders), the time period for a stroke, the presence of vibration in the associated machine, any change in rotation of the associated machine, active operational time of the associated machine, and any multi-directional change in movement of the associated machine.

In some particular non-limiting embodiments, motion sensor 132 includes at least one of an accelerometer or a gyroscope. Accelerometers are known in the art to measure non-gravitational acceleration. Thus, when a component of the associated machine in which wireless sensor 100 is integrated undergoes movement from a standstill to any velocity, the accelerometer of motion sensor 132 responds to vibrations associated with such movement. Gyroscopes are known in the art to sense, measure, or maintain orientation and angular velocity (i.e., track longitudinal and/or track latitudinal movement and/or track altitude movement). In some other non-limiting embodiments, motion sensor 132 includes a 6-axis gyroscope. Thus, the various types of movement data discussed above can be obtained from the associated machine using exemplary motion sensor 132. When motion sensor 132 includes a gyroscope (e.g., 6-axis gyroscope, etc.), the gyroscope can be used to a) measure the speed of movement of a machine or machine part, and/or movement of a piston or cylinder of a spring, b) detect/measure multi-axis movement of a machine or machine part, and/or movement of a piston or cylinder of a spring, c) provide location information regarding the wireless sensor and/or machine or machine part (e.g., location of the wireless sensor or machine or machine part that includes the wireless sensor in a factory, plant, storage room, etc.), d) facilitate in 1) proper location (e.g., machine or machine part is being installed in a proper location on another device or machine, etc.) when installing the machine or machine part, and/or 2) proper positioning and/or proper orientation of a machine or machine part when installing the machine or machine part (e.g., the front face of the machine part is properly facing the front and not the rear during installation, the machine part is installed at the proper angle, the machine part is installed at the proper depth, etc.). When motion sensor 132 includes an accelerometer, the accelerometer measures the speed of movement of a machine or machine part, and/or movement of a piston or cylinder of a spring.

With reference to FIGS. 2, 4-5, and 6, control circuitry 104 includes a plurality of through-holes 134 extending from bottom side 120 to top side 130. The plurality of through-holes 134 are configured to receive a plurality of corresponding connector pins 110. The plurality of connector pins 110 are fixed to the corresponding plurality of through-holes 134 such that one end of each pin is disposed a relatively short distance above top side 120 of control circuitry 104 and the other pin end is disposed a comparatively longer distance below bottom side 130 of control circuitry 104. As can be appreciated, the pins are not required to extend above top side 120 of control circuitry 104 and can be flush with or be positioned below top side 120 of control circuitry 104. The ends of connector pins 110 that are disposed below bottom side 130 of control circuitry 104 extend downward toward a second module of wireless sensor 100. As discussed in further detail below, this second module of wireless sensor 100 is a sensor 106 which measures one or more properties (e.g., pressure and/or temperature, etc.) related to the associated machine or machine part. As shown in FIG. 7, sensor 106 includes a plurality of pin holes 156 disposed on a top side 150 thereof. The plurality of pin holes 156 are configured to telescopically receive a bottom portion of the plurality of connector pins 110 that are extending downward from bottom side 130 of control circuitry 104 such that communication module 102 can be mounted to top side 150 of sensor 106. Typically, pin holes 156 are configured to telescopically receive less than 25% (e.g., 0.1-25% and/or all values and ranges therebetween) of the longitudinal length of connector pins 110, and typically less than 5% of the longitudinal length of connector pins 110. Generally, the cross-sectional shape and cross-sectional area of pin holes 156 are ±5% of the cross-sectional shape and cross-sectional area of the bottom portion of connector pins 110 to be inserted into pin holes 156.

Figure 2:
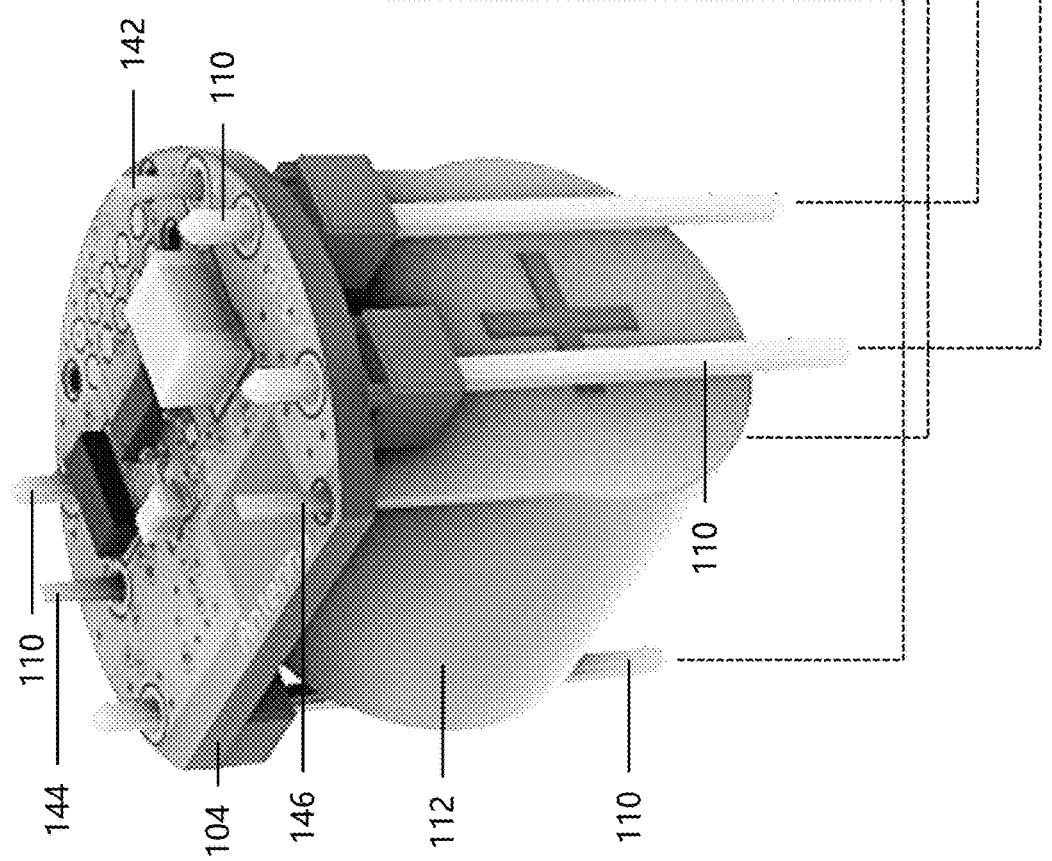
FIG. 2 is an additional view of the wireless sensor of FIG. 1 which illustrates the communications module separate from the pressure/temperature sensor.
Figure 6:
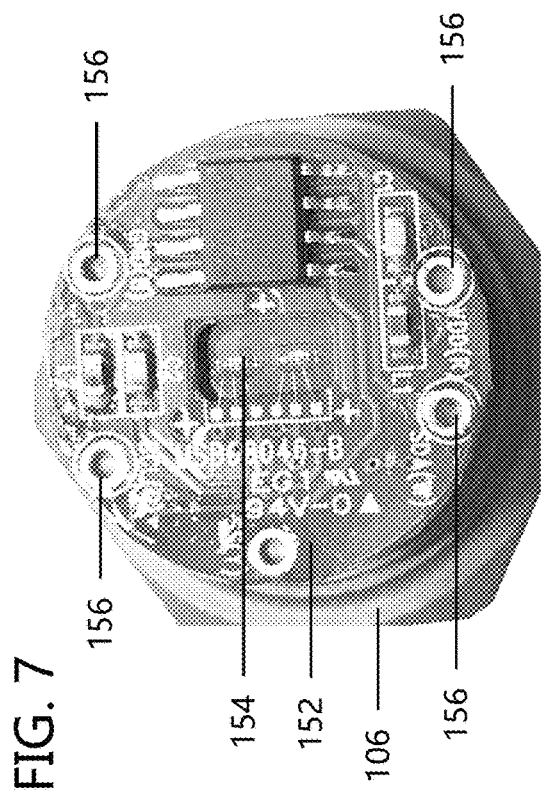
FIG. 6 is a picture according to one non-limiting embodiment of the present disclosure which shows an example communications module prior to assembly with a corresponding pressure/temperature sensor.
Figure 7:
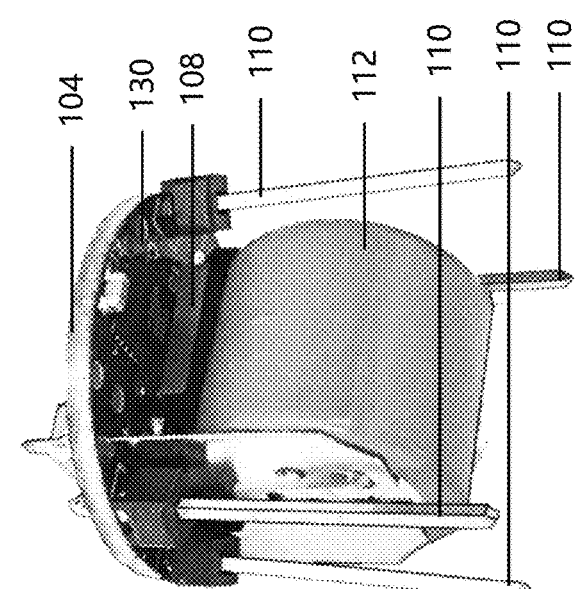
FIG. 7 is a picture according to one non-limiting embodiment of the present disclosure which shows an example pressure/temperature sensor module prior to assembly with the communications module of FIG. 6.
Figure 9:
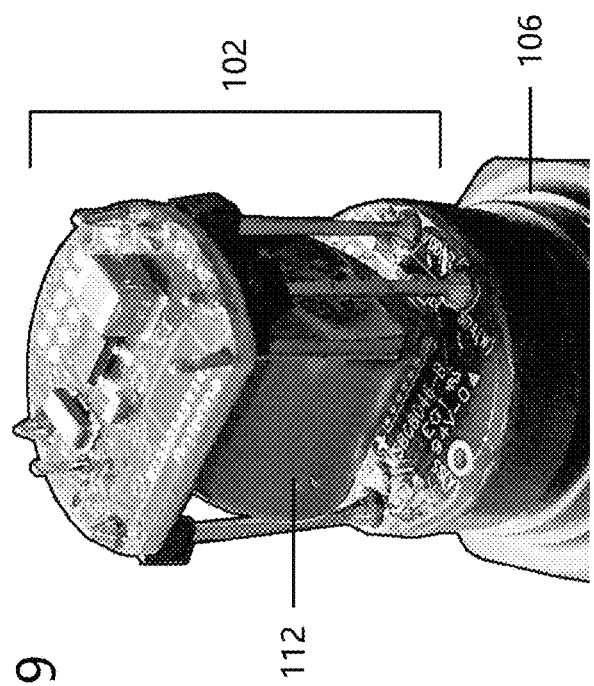
FIG. 9 is a picture according to one non-limiting embodiment of the present disclosure which shows the communications module of FIG. 6 fully mounted to the pressure/temperature sensor of FIG. 7.
Figure 8:
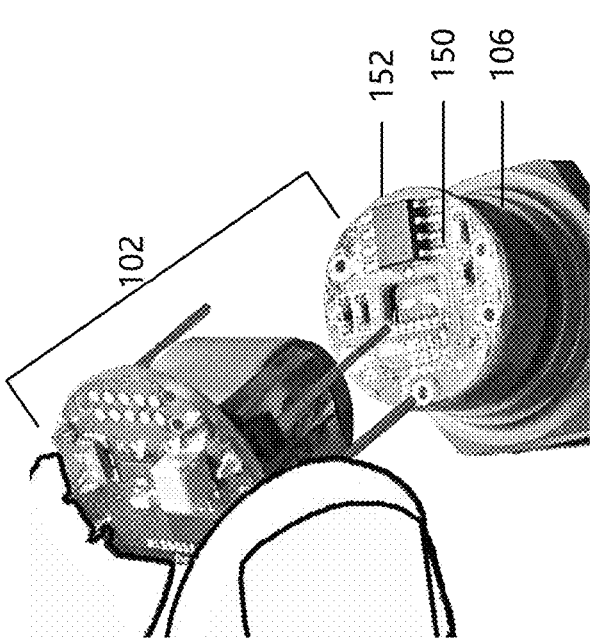
FIG. 8 is a picture according to one non-limiting embodiment of the present disclosure which shows the communications module of FIG. 6 in the process of being mounted to the pressure/temperature sensor of FIG. 7.

As illustrated in FIG. 6, bottom side 130 of control circuitry 104 can optionally include a pin mount or sleeve 131 to facilitate in the connection of the upper portion of connector pins 110 to control circuitry 104. Pin mount or sleeve 131 includes an opening configured to telescopically receive at least a portion of the upper portion of connector pins 110. Generally, the cross-sectional shape and cross-sectional area of the opening in each of pin mount or sleeve 131 is ±5% of the cross-sectional shape and cross-sectional area of the upper portion of connector pins 110 to be inserted into the opening of pin mount or sleeve 131. Typically, pin mount or sleeve 131 is configured to telescopically receive less than 30% (e.g., 0.1-30% and/or all values and ranges therebetween) of the longitudinal length of connector pins 110, and typically less than 25% of the longitudinal length of connector pins 110. As illustrated in FIGS. 1 and 2, a portion of the upper portion of connector pins 110 extends above top side 130 of control circuitry 104. Generally, less than 15% of the longitudinal length of connector pins 110 extends above top side 130 of control circuitry 104. As can be appreciated, the upper end of one or more of connector pins 110 can be flush with top side 130 of control circuitry 104 or positioned below top side 130 of control circuitry 104.

This assembly process of communications module 102 and sensor 106 is represented by the dashed lines connecting FIG. 2 with FIG. 3. In addition, the same assembly process is shown in the pictures of FIGS. 6-9.

The connector pins can be permanently connected to communication module 102 and/or sensor 106. When a permanent connection is formed, such connection can be by solder, weld, adhesive, and the like.

The second module or sensor 106 is typically configured to measure/detect pressure and/or temperature in the associated machine or machine part; however, it should be understood that other properties could similarly be measured without departing from the scope of the present disclosure. Sensor 106 generally has a low input voltage so a single battery can be used to power sensor 106. Moreover, sensor 106 can also include a control circuitry 152 disposed on top side 150. In some particular embodiments, a bottom side 160 of sensor 106 includes a threaded connection or port 162 known in the art to provide a secure, fluid tight attachment with a component of the associated machine or machine part. In some non-limiting embodiments, the threaded connection is a G1/8 thread known in the art (any thread size will work). Thus, threaded connection or port 162 allows sensor 106 to be attached in fluid communication with the associated machine or machine part and to measure one or more properties (i.e., pressure and/or temperature, etc.) at a location adjacent to the threaded connection/port. Moreover, in some non-limiting embodiments, a first temperature can be measured by sensor 106 at the location adjacent threaded connection/port 162, and a second temperature can be measured by a second temperature sensor (not shown) communicatively connected to control circuitry 152 of sensor 106 or control circuitry 104 of the communications module. In such embodiments, the second temperature sensor can be configured to measure/detect and/or record ambient temperature.

Similar to the communications module discussed above, control circuitry 152 of sensor 106 can communicatively connect one or more logic-based devices, such as microprocessors, processors, controllers, or the like. In addition, control circuitry 152 may also include electronic circuits including and/or connecting one or more RAM or ROM memories, logic and timing circuitry, state machine circuitry, input/output (I/O) circuitry, and the like. For example, control circuitry 152 of sensor 106 can include an interface 154 configured to communicatively link with control circuitry 104 of the communications module. In some particular embodiments, interface 154 is an I2C digital interface known in the art and which eliminates the need for analog corrections to communications module 102; however, this is not required. When instructed by the control circuitry 104 of communications module 102 (or sensor control circuitry 152), sensor 106 measures/detects the one or more properties and the communicative link provided by interface 164 is used to output the one or more properties to communications module 102 via one or more of connector pins 110. The property data measured/detected by sensor 106 can be included as part of the data which communications module 102 provides via transmission by the transmitter 108.

Moreover, in some non-limiting embodiments, the control circuitry 104, or a processor thereof, is programmed to correlate the property change data (i.e., pressure and temperature) output by the sensor 106 to the movement data monitored by the motion sensor 132 (i.e., an accelerometer and/or gyroscope). More particularly, the movement data from motion sensor 132 can indicate the total cycle count on a component of the associated machine (e.g., a cylinder of the machine). Based on the correlation of the property change data and movement data by the control circuitry 104 or processor thereof, predictive maintenance for the associated machine can be estimated.

As discussed above with reference to FIGS. 2, 4-5, and 6, a longer portion of each connector pin 110 is disposed below bottom side 130 of control circuitry 104. Thus, communications module 102 is mounted on sensor 106 in spaced relation thereto. The space between communication module 102 and sensor 106 is generally sized such that a battery 112 for powering the communications module can be mounted on bottom side 130 of the control circuitry 104. As shown in FIGS. 1 and 6, the battery is generally disposed between communications module 102 and sensor 106.

With reference to FIGS. 2 and 4-5, battery 112 is mounted to bottom side 130 via the engagement of battery terminals 142, 144, and 146 with corresponding contacts 136, 138, and 140 of control circuitry 104. As illustrated in FIGS. 1, 2, 6 and 9, at least 70% of the battery is located underneath bottom side 130 of control circuitry 104. In one particular configuration, at least 90% of the battery is located underneath bottom side 130 of control circuitry 104. As best illustrated in FIGS. 1 and 9, 90-100% of the battery is located underneath bottom side 130 of control circuitry 104 and also located above top side 150 of sensor 106. Such a battery position provides a smaller footprint of the wireless sensor.

Contacts 136, 138, and 140 optionally extend through control circuitry 104 from bottom side 120 to top side 130. More particularly, positive terminal 142 of battery 112 mounts to corresponding positive contact 136 on control circuitry 104, negative terminal 144 mounts to corresponding negative contact 138, and grounded terminal 146 mounts to corresponding grounded battery contact 140. In some particular embodiments, the terminal and contact connection of control circuitry 104 and battery 112 is a hard-wired connection. In such arrangements, the battery 112 is considered to be non-replaceable.

Once battery 112 has been attached, communications module 102 is ready to be mounted on top of second module or sensor 106. This mounting process is described above, illustrated in FIGS. 2-3, and pictured in FIGS. 6-9. As best illustrated in FIG. 1, battery 112 is spaced above sensor 106 after communications module 102 mounted on top of second module or sensor 106. Such spacing facilitates in reducing damage to sensor 106 and/or causing interference with the detected/measured information by sensor 106 when wireless sensor 100 is subjected to high vibrations or shock during the operation of the machine or machine part.

Figure 11:
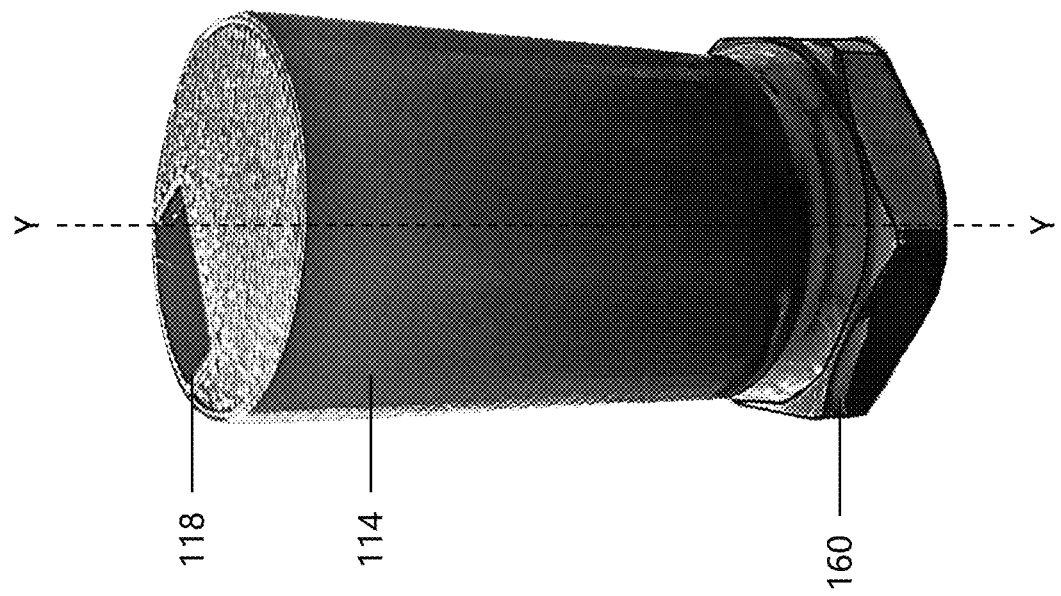
FIG. 11 is a picture according to one non-limiting embodiment of the present disclosure which shows the assembled communications module and pressure/temperature sensor of FIG. 10 having a protective enclosure installed thereon.
Figure 10:
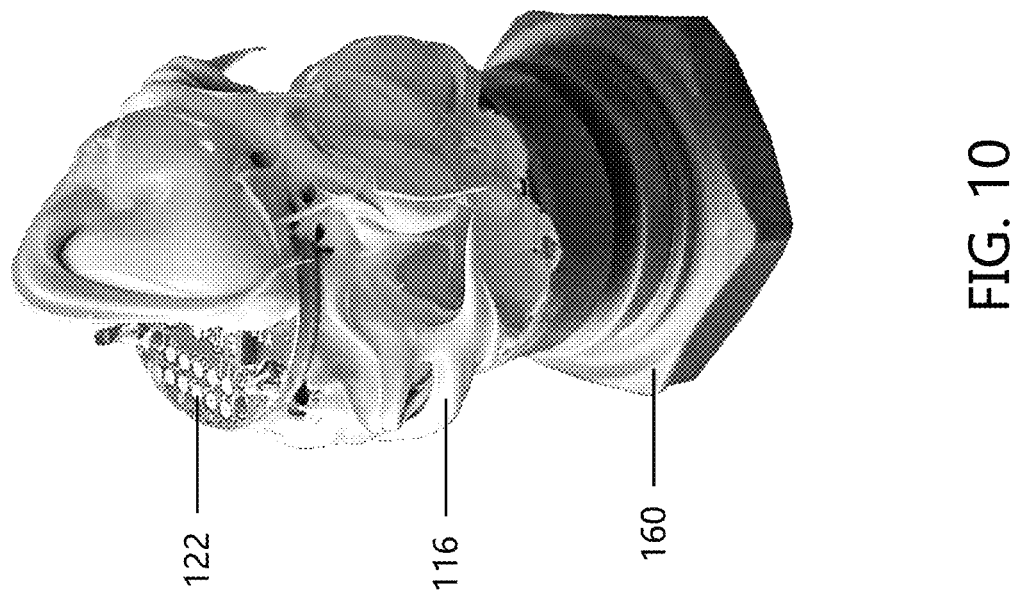
FIG. 10 is a picture according to one non-limiting embodiment of the present disclosure which shows the assembled communications module and pressure/temperature sensor of FIG. 9 having a sealant material applied thereon.

In order to protect communications module 102 and sensor 106 from the harsh operating environment of the associated machinery or machine part, housing or enclosure 114 shown in FIGS. 10 and 11 is installed. In some non-limiting embodiments, a sealant material 116 is first applied to substantially cover the electronic components of communications module 102 and sensor 106. In some particular non-limiting embodiments, sealant material 116 is a silicone, epoxy, or urethane material. As shown in FIG. 10, sealant material 116 is not applied to bottom end 160 of the sensor since no sensitive electronic components are exposed. Generally, about 70-100% (and all values and ranges therebetween) of the components of communications module 102 (not including the top portion of communications module 102 that includes programming/data port 122) are encapsulated within sealant material 116. Generally, 70-100% of the components of sensor 106 located above bottom end 160 of the sensor are encapsulated within sealant material 116 and bottom end 160 of the sensor. As illustrated in FIG. 10, sealant material 116 is not applied over programming/data port 122 on top side 120 of control circuitry 104 of communications module 102 so that the programming/data port can be used after final assembly of device 100. In this regard, an access port 118 is formed on top of enclosure 114 which allows access to the programming/data port 122. Generally, enclosure 114 is formed of a durable material (plastic material, metal material, etc.). Generally, enclosure 114 is permanently connected to bottom end 160 of the sensor (e.g., soldered, welded, adhesively connected). As can be appreciated, sealant material 116 can optionally facilitate in securing enclosure 114 to sensor 106. As illustrated in FIG. 11, enclosure 114 has a generally cylindrical shape and an internal cavity to telescopically receive communications module 102 and a portion of sensor 106.

With reference to FIGS. 1 and 11, communications module 102, sensor 106 (respective components of each module) and enclosure 114 are substantially aligned in a concentric manner along a common central axis Y. The concentric alignment of components gives the wireless sensor 100 a simple exterior profile allowing the sensor to be more easily integrated with an associated machine, whereas more complex shapes can be difficult to install in machinery which commonly has tight clearances between components. Moreover, hardwiring battery 112 to communications module 102 in the non-replaceable manner described above helps to further reduce the size of wireless sensor 100. This is partly because additional components associated with replaceable batteries are not required, thus reducing bulk and size of sensor device 100. The advantageous configuration of the wireless sensor components in accordance with the present disclosure results in a device 100 that is at least about 20% the size of existing commercial pressure sensors. In addition, the smaller cylindrical size allows a deep well socket or tool to fit over the sensor and tighten the hex on the sensor.

In addition to the aforementioned size advantage, having a dedicated, hardwired, and non-replaceable battery 112 allows wireless sensor 100 to be fully sealed with sealant 116 and enclosure 114 described above, thus benefitting the durability of the device. Durability is further improved by forming device 100 to function in a completely wireless manner, where no external buttons or switches are required. Furthermore, installing battery 112 in the middle of device 100 between control circuitry 104 of communications module 102 and sensor 106 permits both antenna 126 and optional magnetic sensor 124 to be mounted on the top/outer portion of device 100. This helps to prevent the blockage of signals to and from antenna 126 and optional magnetic sensor 124.

An exemplary operation of a wireless sensor 100 made in accordance with the present disclosure will now be discussed. On a first power or boot-up process of wireless sensor 100, control circuitry 104 provides a debug message including a unique identifier for the device. In some embodiments, a processor of control circuit 104 performs this step. If desired, this unique identifier can be used as a serial number for tracking purposes. After boot-up, control circuitry 104 or processor thereof places wireless sensor 100 in a "storage mode". In the storage mode, transmitter 108 is disabled and no wireless protocol is transmitted. In addition, motion sensor 132, which may comprise at least one of an accelerometer and/or gyroscope, is also disabled. Wireless sensor 100 can thereafter be placed in the "running mode". Wireless sensor 100 can be configured such that when an operator/user momentarily holds a magnet close to the device, magnetic sensor 126 detects the magnetic force. Once the magnetic force is detected by magnetic sensor 126, control circuitry 104 or processor thereof activates motion sensor 132 to detect motion thereafter be placed in the associated machine. Control circuitry 104 or processor thereof instructs transmitter 108 to transmit the associated machine data measured/detected by sensor 102 at specified intervals of time via the beacon-type wireless protocol. In some non-limiting embodiments, the "running mode" of wireless sensor 100 transmits associated machine data measured/detected by motion sensor 106 every 1-10 seconds. In other non-limiting embodiments, control circuitry 104 or processor thereof instructs transmitter 108 to utilize a transmit power of between about +18 dBm and 0.2 dBm (and all values and ranges therebetween). This transmit power advantageously provides better reception for associated receiver devices that are both near and far away. Next, control circuitry 104 or processor thereof requests associated machine data from sensor 106 (e.g., pressure and/or temperature readings, etc.). Control circuitry 104 or processor thereof then instructs transmitter 108 to transmit the associated machine data measured by sensor 106 at specified intervals of time via the wireless protocol. In some non-limiting embodiments, the "running mode" of device 100 transmits associated machine data measured by sensor 106 every 1-10 seconds (and all values and ranges therebetween). Transmission at such timed intervals helps to conserve power and increase battery life. If desired, an "on-demand" mode can be activated when an operator/user momentarily holds a magnet close to a device which is already in "running mode". Once magnetic sensor 126 detects the magnetic force, the "on-demand" mode is activated, and control circuitry 104 or processor thereof instructs transmitter 108 to continuously transmit the associated machine data measured by motion sensor 132 and/or sensor 106 at customized, pre-programmed intervals of time. In some non-limiting embodiments, the "on-demand" mode of device 100 transmits associated machine data measured by motion sensor 132 and/or sensor 106 every 100 milliseconds. The "storage mode" of the device can be reactivated from the "running mode" or "on-demand mode" at any time by an operator/user holding a magnet close to device 100 for an extended period of time. In some non-limiting embodiments, the magnet is held for about 10 seconds or more to reactivate "storage mode". Once magnetic sensor 126 detects the magnetic force for the extended period of time, the "storage mode" is reactivated, and control circuitry 104 or processor thereof instructs transmitter 108, motion sensor 132, and sensor 106 to deactivate.

It should be understood upon reading the present disclosure that, while wireless sensor 100 has largely been described and shown in reference to a single device, the use of a plurality of wireless sensors in a system is also contemplated by the present disclosure. In a system that incorporates a plurality of wireless sensors formed in accordance with the present disclosure, it should be understood that each wireless sensor in the plurality generally includes all of the exemplary components and features discussed above, including exemplary communications module 102 and property change sensor 106. Furthermore, in a system which utilizes a plurality of wireless sensors, it is further contemplated that a plurality of external receiver devices (e.g., smartphone, tablet, laptop computer, computer, server, cloud system, mainframe, enterprise data warehouse, data lake, custom receiver display devices, data hubs, etc.) can be included, where each receiver device in the plurality can communicatively link with the communications module of each wireless sensor in the plurality. In this regard, one or all of the external receiver devices are configured to simultaneously receive the associated machine data provided by the communications module of one or each wireless sensor in the plurality.

As discussed above, wireless sensor 100 of the present disclosure is generally configured for use in a component of an associated machine or machine part. One exemplary machine/machine component in which wireless sensor 100 may be installed in accordance with the present disclosure includes, but is not limited to, hydraulic cylinders and springs. Common applications which use hydraulic cylinders or springs include springs used in metal stamping, oil and gas drilling rigs, cranes, shipbuilding, steel mills, foundries, mining operations, rubber and plastics machinery, offshore, etc., and the like. Machines in these and other applications often require hydraulic or pneumatic systems to produce linear motion. Cylinders are used to produce this linear motion by converting fluid pressure and flow to force and velocity, respectively. Thus, wireless sensors 100 disclosed herein are used to measure, record, and transmit data associated with machine components such as the cylinders discussed above.

With reference to FIGS. 12-16, various examples of associated machines/machine parts are provided which are suitable for integration with wireless sensors 100 described herein. In FIG. 12, a first exemplary associated machine 170 includes a piston or rod component 172. Rod 172 is formed with a central sealed chamber 174 configured to receive a wireless sensor formed in accordance with the present disclosure. In FIG. 13, a second exemplary associated machine 176 includes a cylinder component 178. Cylinder component 178 includes a sidewall portion 180 configured to receive a wireless sensor formed in accordance with the present disclosure. In FIG. 14, a third exemplary associated machine 182 includes a cylinder component 184. The cylinder component 184 includes a base portion 186 configured to receive a wireless sensor formed in accordance with the present disclosure. In FIGS. 15A and 15B, a fourth exemplary associated machine 188 includes a pressurized chamber and safety release valve component 190. Safety release valve 190 is formed with a central sealed chamber 192 configured to receive a wireless sensor formed in accordance with the present disclosure.

Finally, in FIG. 16, a fifth exemplary associated machine 194 includes port plug component 196. Port plug 196 is formed with a central chamber 198 configured to receive a wireless sensor formed in accordance with the present disclosure.

Referring now to FIGS. 17-20, there are illustrated several non-limiting displays from a smart device, wherein the smart device has a loaded app configured to receive and display information from one or more wireless sensors 100. As can be appreciated, an app for a smart device can be configured to have a different layout, display different information, etc. The left-side app display of FIG. 17 illustrates the app display wherein no information is being received by the app from a wireless sensor 100. As such, the app optionally includes 1) the company name, 2) date, 3) time, 4) app version number, 5) start/restart button, and/or 7) unit change button. As can be appreciated, other or additional information can be displayed (e.g., date/time app last used, app update button, data transmission button, data store button, sensor search/list button, etc.).

The right-side app display of FIG. 17 illustrates the app display receiving information from a plurality of wireless sensors 100. A dividing line/bar visually indicates the data from the different wireless sensors 100. The type of information disclosed for each sensor can be the same or different. The app can optionally be configured to change the type of data displayed for a certain wireless sensor 100. As illustrated at the bottom of the right-side app display of FIG. 17, only a portion of information from a wireless sensor 100 is being displayed. The sample app display indicates that data from at least three wireless sensor 100 can be simultaneously displayed on the app; however, it can be appreciated that the app can be configured to only display full information for one or two wireless sensors 100, or more than three wireless sensors 100. If data is being received by the app from more wireless sensors 100 than can be displayed, the app can be configured to all the display to be scrolled so that data from other wireless sensors 100 can be displayed.

When the smart device app receives information from more wireless sensors 100 than can be displayed, the smart device app can be optionally configured to display certain wireless sensors 100 based on 1) strongest signal strength received from wireless sensor 100, 2) more recently updated dated transmitted by wireless sensor 100, 3) an error has been received from wireless sensor 100, 4) data received from the wireless sensor 100 is outside a predefined parameter, 5) wireless sensor 100 is about to enter and/or has entered a power down mode, and/or 6) a magnetic device has been moved into close proximity to wireless sensor 100.

For each wireless sensor 100 displayed on the app, if the information being received by the app is more than can be displayed, the app can be optionally configured to 1) allow a user to select a particular data set of a wireless sensor and expand/reduce the size of the data set so more/less data is displayed for wireless sensor 100 on the app, 2) allow a user to scroll data for a particular wireless sensor 100 on the app, and/or 3) allow a user to select a particular data set of a wireless sensor to cause the display on the app to only display the selected wireless sensor 100.

Figure 18:
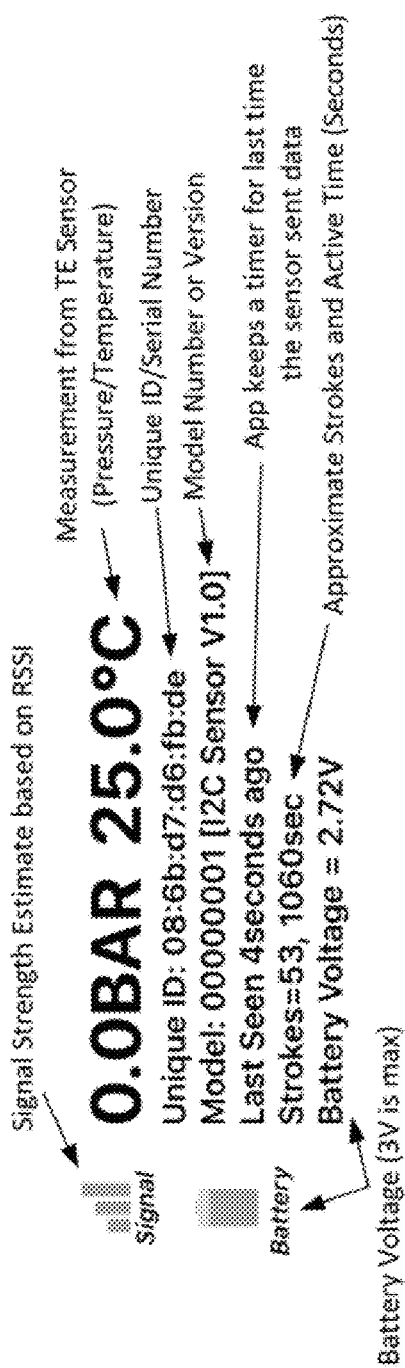
Figure 19:

Referring now to FIGS. 17-19, certain types of non-limiting data are displayed on the app for each wireless sensor 100. As best illustrated in FIG. 19, the top portion of the app display can optionally be configured to provide 1) brand information, 2) company name, 3) facility name information, etc. The top portion of the app display can optionally be configured to provide 1) date information, 2) time information, 3) app version information, etc. The top portion of the app display can optionally be configured to provide a touchscreen button for 1) restarting app, 2) changing units displayed for the wireless sensors 100, etc. As can be appreciated, other or additional information can be displayed on the top portion of the app display.

FIG. 18 illustrates in detail the type of non-limiting data that can be received from a wireless sensor 100 and displayed on the smart device app. Such information includes 1) signal strength received by the smart device from a particular wireless sensor 100, 2) battery life of wireless sensor 100, 3) battery voltage of wireless sensor 100, 4) ID/serial number of wireless sensor 100, 5) model/version number of wireless sensor 100, 6) pressure reading from wireless sensor 100, 7) temperature reading from wireless sensor 100, 8) time period the app last received updated data from wireless sensor 100, 9) time period in which wireless sensor 100 has been actively receiving sensor information and wirelessly transmitting data, 10) number of strokes of a machine or machine part connected to wireless sensor 100, etc. As can be appreciated, other or additional information can be displayed. The format for displaying the data on the app display is non-limiting. As illustrated in FIG. 18, the signal strength and battery life information are illustrated by a graphics representation whereas the other displayed data is presented in numeric form.

Figure 20:
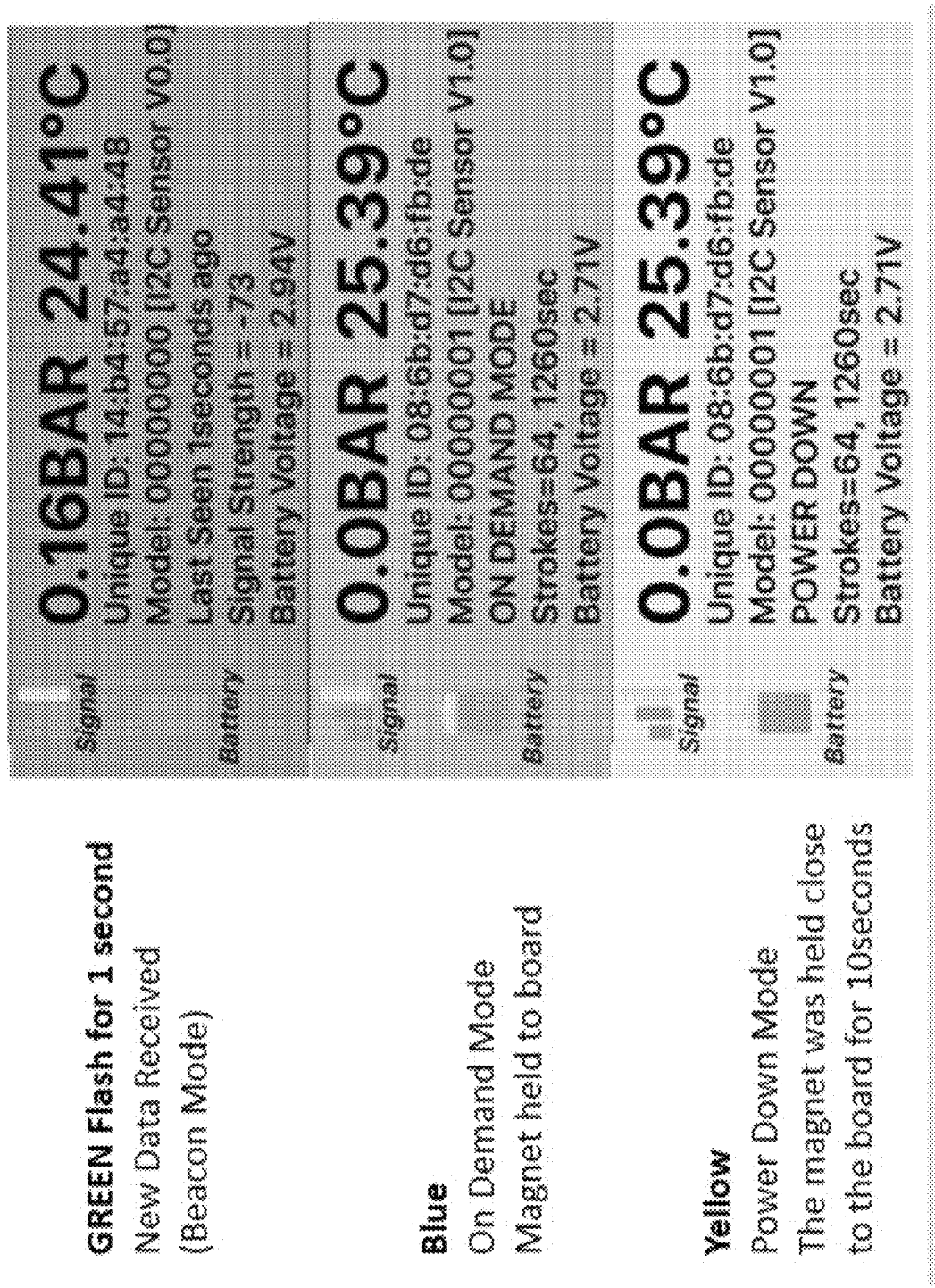

Referring now to FIG. 20, the smart device app can optionally be configured to highlight data about a wireless sensor 100 when 1) new data is received from wireless sensor 100, 2) an error has been received from the wireless sensor 100, 3) data received from wireless sensor 100 is outside a predefined parameter, 4) wireless sensor 100 is about to enter and/or has entered a power down mode, and/or 5) a magnetic device has been moved into close proximity to wireless sensor 100. The highlighting can be by coloring the data, flashing of the data, font change of data, etc. Such highlighting can be used to more easily identify a certain wireless sensor 100 while using the app and/or monitor the operation or sleep/active state of wireless sensor 100 via the smart device app. As illustrated in FIG. 20, the smart device app is configured to color the data (e.g., green color, etc.) to indicate that new data was transmitted and received by the smart device app. As illustrated in FIG. 20, the smart device app is configured to color the data (e.g., blue color, etc.) to indicate that a magnet has been brought in close proximity to a particular wireless sensor 100. This feature can verify to the user of the smart device app the particular location of wireless sensor 100. Also, if such wireless sensor 100 is not currently displayed on the display of the smart device, the smart device app can be optionally configured to cause such wireless sensor 100 to be displayed. As illustrated in FIG. 20, the smart device app is configured to color the data (e.g., yellow color, etc.) to indicate that a magnet has been brought in close proximity to a particular wireless sensor 100 and held for a certain period of time (5-10 sec., etc.) to cause wireless sensor 100 to enter a power down mode. Also, if such wireless sensor 100 is not currently displayed on the display of the smart device, the smart device app can be optionally configured to cause such wireless sensor 100 to be displayed.

Also, if such wireless sensor 100 is not currently displayed on the display of the smart device, the smart device app can be optionally configured to cause such wireless sensor 100 to be displayed.

Figure 21:
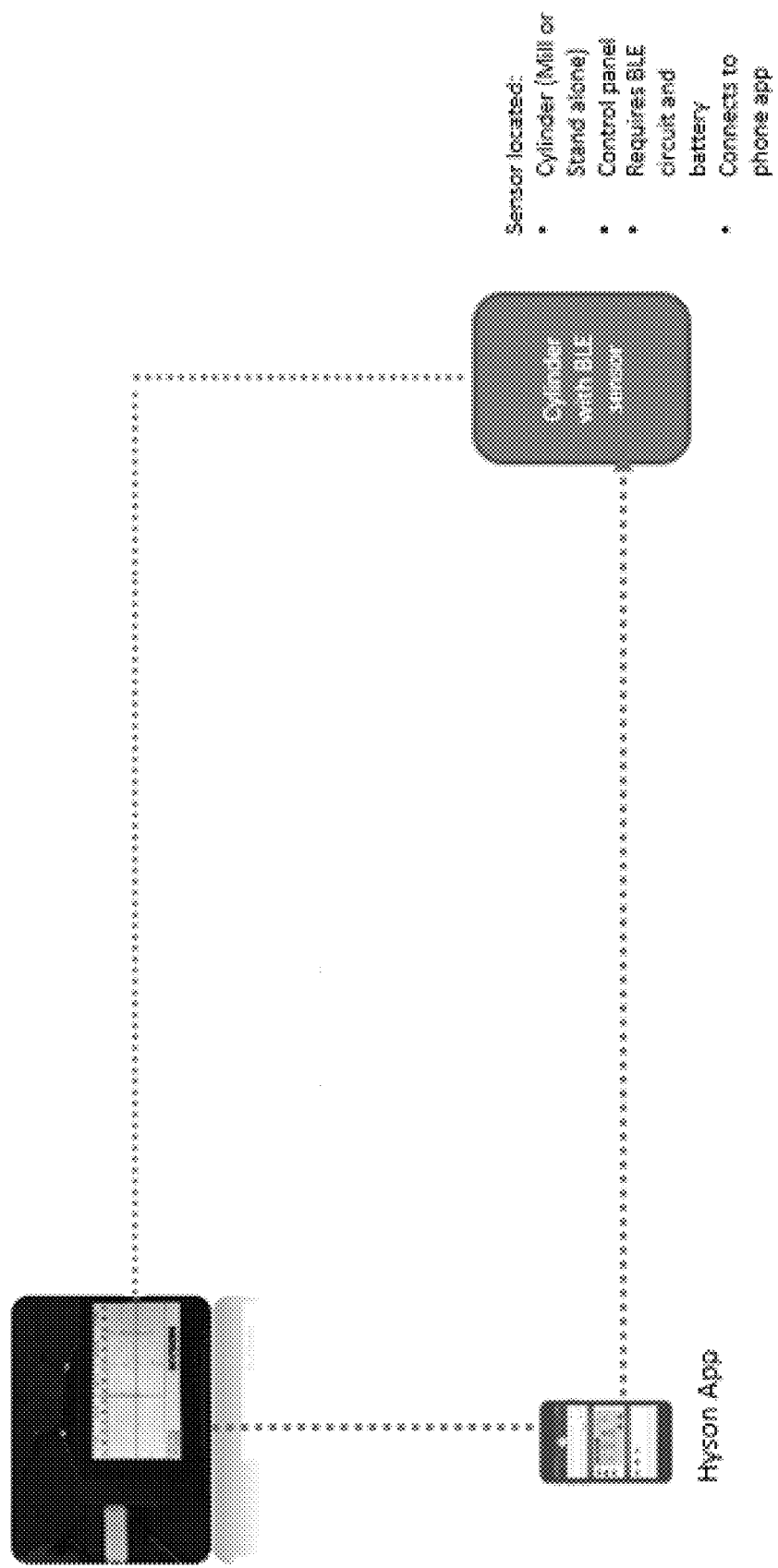

Referring now to FIG. 21, there is illustrated a wireless sensor 100 transmitting information wirelessly via a Bluetooth® protocol and being received by a smart device app (e.g., Hyson App, etc.) and/or by another smart device (e.g., data hub, computer, network, etc.). As also illustrated, the smart device app can also or alternatively transmit data received from one or more wireless sensors 100 to another smart device. As can further be appreciated, the smart device app can also or alternatively receive data from another smart device about one or more wireless sensors 100 wherein the other smart device received data from one or more wireless sensors 100 and/or wherein the other smart device received data from another smart device that has received data about one or more wireless sensors 100. As such, data displayed on the smart device can be from one or more wireless sensors 100 located in a facility where the user of the smart device app is located and/or the displayed data can be from one or more wireless sensors 100 located remotely from the user (e.g., different building, facility located in a different state or country, etc.). As such, the smart device app can be used monitor wireless sensors 100 located at 1) a single facility or 2) multiple facilities.

It will thus be seen that the objects set forth above, among those made apparent from the preceding description, are efficiently attained, and since certain changes may be made in the constructions set forth without departing from the spirit and scope of the disclosure, it is intended that all matter contained in the above description and shown in the accompanying drawings shall be interpreted as illustrative and not in a limiting sense. The disclosure has been described with reference to preferred and alternate embodiments. Modifications and alterations will become apparent to those skilled in the art upon reading and understanding the detailed discussion of the disclosure provided herein. This disclosure is intended to include all such modifications and alterations insofar as they come within the scope of the present disclosure. It is also to be understood that the following claims are intended to cover all of the generic and specific features of the disclosure herein described and all statements of the scope of the disclosure, which, as a matter of language, might be said to fall therebetween.

What is claimed:

1. A wireless sensor for an associated machine or machine part, comprising:
   a property sensor having a communicative link and one or both of a pressure sensor and a temperature sensor; said property sensor is configured to measure/detect a property related to the associated machine or machine part; said communicative link is configured to output data representative of said property; said property includes one or both of pressure information and temperature information;
   a communications module having control circuitry; said communications module configured to wirelessly transmit at least some of data representative of said property received from said communicative link of said property sensor; said control circuitry is configured to a) control information received from said property sensor and b) control information wirelessly transmitted by said communications module;
   an energy source configured to provide power to said property sensor and/or said communications module;
   a sensor mount that is configured to connect to the associated machine or machine part; and,
   a housing structure; said housing structure connected to said sensor mount and configured to at least partially contain said a communications module and/or said energy source within said housing structure when said housing structure is connected to said sensor mount; and,
   wherein said property sensor, said energy source, and said communications module are electromechanically arranged in a stack.

2. The wireless sensor as defined in claim 1, further including a plurality of connector pins; said plurality of connection pins arranged to physically and communicatively couple said communications module to said property sensor; two or more of said plurality of connection pins are configured to communicate electronic data, electrical signals, and/or power between said control circuitry and said property sensor; two or more of said plurality of connection pins are configured to rigidly connect said communications module to said property sensor.

3. The wireless sensor as defined in claim 2, wherein one or more of said connector pins a) has a top portion that is permanently connected to said control circuitry, b) has a bottom portion that is permanently connected to said property sensor, and c) provides structural support between said control circuitry and said property sensor in said stack.

4. The wireless sensor as defined in claim 3, wherein said energy source is positioned between at least a portion of said control circuitry and said property sensor.

5. The wireless sensor as defined in claim 4, further including a sealing material positioned in an interior of said housing structure; at least a portion of said control circuitry and/or said property sensor encapsulated in said sealing material; said sealing material configured to secure a) one or more components of said communications module to one said property sensor, b) one or more components of said communications module to said interior of said housing structure, and/or c) one said property sensor to said interior of said housing structure; said sealing material including one or more of polyester resin, epoxy resin, polyurethane resin, and/or silicon resin.

6. The wireless sensor as defined in claim 5, wherein said control circuitry further includes a magnetic sensor/switch; said magnetic sensor/switch includes a Hall effect sensor; said magnetic sensor/switch configured to perform one or more functions selected from the group consisting of a) manually activate said wireless sensor by use of a handheld magnet and/or other type of magnetic device, b) manually deactivate said wireless sensor by use of a handheld magnet and/or other type of magnetic device, c) manually place said wireless sensor into one or more sleep modes by use of a handheld magnet and/or other type of magnetic device, d) manually wake said wireless sensor from one or more sleep modes by use of a handheld magnet and/or other type of magnetic device, e) cause said wireless sensor to transmit a signal that indicates that a handheld magnet and/or other type of magnetic device has been placed in close proximity to said magnetic sensor/switch, f) cause said wireless sensor to move from a sleep mode to an operational/run mode and to transmit information normally transmitted by said wireless sensor while in said operational/run mode, and g) change a time interval between wireless information/data transmission by said wireless sensor.

7. The wireless sensor as defined in claim 6, wherein said control circuitry further includes a motion sensor that measures/detects data related to movement of said wireless sensor and/or said the associated machine or machine part; said motion sensor includes an accelerometer or gyroscope; said motion sensor configured to perform one or more functions selected from the group consisting of a) facilitate in providing track location movement of said wireless sensor, b) facilitate in providing location movement information of a machine or machine part to which said wireless sensor is connected thereto, c) facilitate in providing information about whether a machine or machine part properly or improperly operating, d) provide information about speed movement of at least one component of a machine or machine part, e) detecting and/or measuring multi-axis movement of at least one component of a machine or machine part, and f) facilitate in ensuring a machine or machine part is positioned and/or mounted in a proper location and/or orientation.

8. The wireless sensor as defined in claim 7, wherein said control circuitry includes a transmitter that transmits said property data using a wireless protocol; said wireless protocol is beacon mode to enable transmission to an external smart device without having to first pair with said smart device; said smart device includes one or more of a smartphone, a tablet, and a laptop computer.

9. The wireless sensor as defined in claim 8, wherein said information data further includes one or more of a) model number of said wireless sensor, b) firmware version used in said wireless sensor, c) serial number of said wireless sensor, d) location information of said wireless sensor, e) movement information of said wireless sensor, f) battery status/level information of said wireless sensor, g) voltage information of said wireless sensor, h) signal strength information of said wireless sensor, i) operation mode of said wireless sensor, j) unique identifier information of said wireless sensor, k) power level of said wireless sensor, l) energy level of said energy source in said wireless sensor, m) error information regarding said wireless sensor, n) operational time of said wireless sensor, o) operational/run mode or sleep mode information of said wireless sensor, p) highest pressure measured/detected by said wireless sensor, q) series of the highest pressures measured/detected by said wireless sensor, r) highest temperature measured/detected by said wireless sensor, s) series of the highest temperatures measured/detected by said wireless sensor, t) date and/or time associated with one or more of said measured/detected properties, u) number of times a measured/detected property of a machine or machine part falls outside a set parameter or parameter range, v) number of times a measured/detected property of a machine or machine part meets a set parameter or falls within a parameter range, u) vibration level information of a machine or machine part, v) duty time of a machine or machine part, and w) number of times said wireless sensor wirelessly transmitted information during a certain time period.

10. The wireless sensor as defined in claim 1, wherein said energy source is positioned between at least a portion of said control circuitry and said property sensor.

11. The wireless sensor as defined in claim 1, further including a sealing material positioned in an interior of said housing structure; at least a portion of said control circuitry and/or said property sensor encapsulated in said sealing material; said sealing material configured to secure a) one or more components of said communications module to one said property sensor, b) one or more components of said communications module to said interior of said housing structure, and/or c) one said property sensor to said interior of said housing structure; said sealing material including one or more of polyester resin, epoxy resin, polyurethane resin, and/or silicon resin.

12. The wireless sensor as defined in claim 1, wherein said control circuitry further includes a magnetic sensor/switch; said magnetic sensor/switch includes a Hall effect sensor; said magnetic sensor/switch configured to perform one or more functions selected from the group consisting of a) manually activate said wireless sensor by use of a handheld magnet and/or other type of magnetic device, b) manually deactivate said wireless sensor by use of a handheld magnet and/or other type of magnetic device, c) manually place said wireless sensor into one or more sleep modes by use of a handheld magnet and/or other type of magnetic device, d) manually wake said wireless sensor from one or more sleep modes by use of a handheld magnet and/or other type of magnetic device, e) cause said wireless sensor to transmit a signal that indicates that a handheld magnet and/or other type of magnetic device has been placed in close proximity to said magnetic sensor/switch, f) cause said wireless sensor to move from a sleep mode to an operational/run mode and to transmit information normally transmitted by said wireless sensor while in said operational/run mode, and g) change a time interval between wireless information/data transmission by said wireless sensor.

13. The wireless sensor as defined in claim 1, wherein said control circuitry further includes a motion sensor that measures/detects data related to movement of said wireless sensor and/or said the associated machine or machine part; said motion sensor includes an accelerometer or gyroscope; said motion sensor configured to perform one or more functions selected from the group consisting of a) facilitate in providing track location movement of said wireless sensor, b) facilitate in providing location movement information of a machine or machine part to which said wireless sensor is connected thereto, c) facilitate in providing information about whether a machine or machine part properly or improperly operating, d) provide information about speed movement of at least one component of a machine or machine part, e) detecting and/or measuring multi-axis movement of at least one component of a machine or machine part, and f) facilitate in ensuring a machine or machine part is positioned and/or mounted in a proper location and/or orientation.

14. The wireless sensor as defined in claim 1, wherein said control circuitry includes a transmitter that transmits said property data using a wireless protocol; said wireless protocol is beacon mode to enable transmission to an external smart device without having to first pair with said smart device; said smart device includes one or more of a smartphone, a tablet, and a laptop computer.

15. The wireless sensor as defined in claim 1, wherein said information data further includes one or more of a) model number of said wireless sensor, b) firmware version used in said wireless sensor, c) serial number of said wireless sensor, d) location information of said wireless sensor, e) movement information of said wireless sensor, f) battery status/level information of said wireless sensor, g) voltage information of said wireless sensor, h) signal strength information of said wireless sensor, i) operation mode of said wireless sensor, j) unique identifier information of said wireless sensor, k) power level of said wireless sensor, l) energy level of said energy source in said wireless sensor, m) error information regarding said wireless sensor, n) operational time of said wireless sensor, o) operational/run mode or sleep mode information of said wireless sensor, p) highest pressure measured/detected by said wireless sensor, q) series of the highest pressures measured/detected by said wireless sensor, r) highest temperature measured/detected by said wireless sensor, s) series of the highest temperatures measured/detected by said wireless sensor, t) date and/or time associated with one or more of said measured/detected properties, u) number of times a measured/detected property of a machine or machine part falls outside a set parameter or parameter range, v) number of times a measured/detected property of a machine or machine part meets a set parameter or falls within a parameter range, u) vibration level information of a machine or machine part, v) duty time of a machine or machine part, and w) number of times said wireless sensor wirelessly transmitted information during a certain time period.

16. A non-transitory computer readable storage medium having stored contents arranged as a smart device app that configures a smart device to perform a smart device method; the smart device method comprising:
receiving information from a plurality of wireless sensors without having to pair with any of said plurality of wireless sensors; each of said plurality of wireless sensors includes:
a property sensor having a communicative link and one or both of a pressure sensor and a temperature sensor; said property sensor is configured to measure/detect a property related to the associated machine or machine part; said communicative link is configured to output data representative of said property; said property includes one or both of pressure information and temperature information;
a communications module having control circuitry; said communications module configured to wirelessly transmit at least some of data representative of said property received from said communicative link of said property sensor; said control circuitry is configured to a) control information received from said property sensor and b) control information wirelessly transmitted by said communications module;

an energy source configured to provide power to said property sensor and/or said communications module;

a sensor mount that is configured to connect to the associated machine or machine part; and, a housing structure; said housing structure connected to said sensor mount and configured to at least partially contain said a communications module and/or said energy source within said housing structure when said housing structure is connected to said sensor mount; and, wherein said property sensor, said energy source, and said communications module are electromechanically arranged in a stack; and causing at least some of the information that has been received from said one or more wireless sensors to be displayed on a display of the smart device.

17. The non-transitory computer readable storage medium as defined in claim 16, wherein said smart device method further comprises:

causing said display of said smart device to display one or more of 1) a company name, 2) a date, 3) a time, 4) an app version number, 5) a start/restart button, 6) a unit change button, 7) a date/time said smart device app was last used, 8) an app update button, 9) a data transmission button, 10) a data store button, 11) a sensor search/list button, 12) a signal strength received by said smart device from a particular wireless sensor, 13) a battery life of one or more wireless sensors, 14) a battery voltage of one or more wireless sensors, 15) an ID/serial number of one or more wireless sensors, 16) a model/version number of one or more wireless sensors, 17) a pressure reading from one or more wireless sensors, 18) a temperature reading from one or more wireless sensors, 19) a time period during which said smart device app last received updated data from one or more wireless sensors, 20) a time period during which one or more wireless sensors actively receives sensor information and wirelessly transmits data, and 21) a number of strokes of a particular machine or machine part that is connected to one or more wireless sensors.

18. The non-transitory computer readable storage medium as defined in claim 16, wherein the smart device method further comprises:

displaying certain wireless sensor identifiers on the smart device display based on a) strongest signal strength received from one or more wireless sensors, b) more recently updated data transmitted by one or more wireless sensors, c) an error received from one or more wireless sensors, d) data received from one or more wireless sensors is outside a predefined parameter, e) an indication that one or more wireless sensors is about to enter and/or has entered a power down mode, and/or f) a magnetic device has been moved into close proximity to one or more wireless sensors.

19. The non-transitory computer readable storage medium as defined in claim 16, wherein the smart device method further comprises:

highlighting data about one or more wireless sensor identifiers displayed on the smart device when 1) Previously Presented data is received from the one or more wireless sensors, 2) an error has been received from the one or more wireless sensors, 3) data received from the one or more wireless sensors is outside a predefined parameter, 4) the one or more wireless sensors is about to enter and/or has entered a power down mode, and/or 5) a magnetic device has been moved into close proximity to the one or more wireless sensors.

20. A smart device app method, comprising:

wirelessly receiving information from a plurality of wireless sensors without having to pair with any of the wireless sensors;

causing information that has been received from said one or more wireless sensors to be displayed on a display of a first smart device; and wherein each wireless sensor includes:

a property sensor having a communicative link and one or both of a pressure sensor and a temperature sensor; said property sensor is configured to measure/detect a property related to the associated machine or machine part; said communicative link is configured to output data representative of said property; said property includes one or both of pressure information and temperature information;

a communications module having control circuitry; said communications module configured to wirelessly transmit at least some of data representative of said property received from said communicative link of said property sensor; said control circuitry is configured to a) control information received from said property sensor and b) control information wirelessly transmitted by said communications module;

an energy source configured to provide power to said property sensor and/or said communications module;

a sensor mount that is configured to connect to the associated machine or machine part; and, a housing structure; said housing structure connected to said sensor mount and configured to at least partially contain said a communications module and/or said energy source within said housing structure when said housing structure is connected to said sensor mount; and, wherein said property sensor, said energy source, and said communications module are electromechanically arranged in a stack.

* * * * *